United States Patent
Ikebuchi

(10) Patent No.: US 8,198,674 B2
(45) Date of Patent: Jun. 12, 2012

(54) SEMICONDUCTOR DEVICE AND MANUFACTURING METHOD THEREOF

(75) Inventor: Yoshinori Ikebuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 220 days.

(21) Appl. No.: 12/781,484

(22) Filed: May 17, 2010

(65) Prior Publication Data

US 2010/0295121 A1    Nov. 25, 2010

(30) Foreign Application Priority Data

May 21, 2009    (JP) .................................. 2009-123020

(51) Int. Cl.
*H01L 29/66* (2006.01)

(52) U.S. Cl. ...................................... 257/328; 257/329
(58) Field of Classification Search .................. 257/328, 257/329

See application file for complete search history.

(56) References Cited

U.S. PATENT DOCUMENTS

| | | | |
|---|---|---|---|
| 6,707,706 B2* | 3/2004 | Nitayama et al. | 365/149 |
| 7,321,514 B2* | 1/2008 | Schwerin | 365/189.011 |
| 7,872,301 B2* | 1/2011 | Takaishi | 257/328 |
| 7,943,978 B2* | 5/2011 | Kim et al. | 257/296 |
| 2008/0283907 A1 | 11/2008 | Takaishi | |

FOREIGN PATENT DOCUMENTS

JP    2007-123415    5/2007
JP    2008-288391    11/2008

* cited by examiner

*Primary Examiner* — Douglas Menz
(74) *Attorney, Agent, or Firm* — McDermott Will & Emery LLP

(57) ABSTRACT

To provide a semiconductor device including a first silicon pillar, an interlayer dielectric film provided on an upper surface of the first silicon pillar and having a through-hole filled with a conductive material, and a first-diffusion-layer contact plug provided on an upper-side opening of the through-hole. An area of a lower-side opening of the through-hole is equal to an area of the upper surface of the first silicon pillar, and an area of the upper-side opening of the through-hole is larger than the area of the lower-side opening of the through-hole. With this configuration, an area of a contact surface between the conductive material within the through-hole and the first-diffusion-layer contact plug is larger than the area of the upper surface of the first silicon pillar.

8 Claims, 20 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly relates to a vertical transistor using silicon pillars and a manufacturing method thereof.

2. Description of Related Art

Improvement in integration of semiconductor devices has so far been achieved by mainly downscaling transistors. However, the downscaling of transistors has almost reached its limit, and if transistor sizes are further decreased, the transistors have a risk of being unable to operate correctly due to a short-channel effect and the like.

To fundamentally solve this problem, there is proposed a method of three-dimensionally processing a semiconductor substrate, thereby three-dimensionally forming a transistor. Particularly, a three-dimensional transistor using, for a channel, silicon pillars perpendicularly extended with respect to a main surface of the semiconductor substrate has an advantage of a smaller occupied area and capable of obtaining a large drain current by complete depletion. Further, this transistor can achieve the closest layout of $4F^2$ (see Japanese Patent Application Laid-open Nos. 2007-123415 and 2008-288391).

In the three-dimensional transistor described above, a conductive layer is formed on an upper part of the silicon pillars. This conductive layer is, for example, a diffusion layer that becomes either a source or a drain of the transistor. An upper part of the conductive layer is connected to a contact plug, and is further connected to an upper wiring layer and the like via this contact plug.

The conductive layer is formed in self-alignment by using a silicon-nitride film mask used to form silicon pillars, as disclosed in Japanese Patent Application Laid-open No. 2008-288391, for example. That is, to form a three-dimensional transistor, silicon pillars are first formed by dry etching by using a silicon-nitride film mask, and an interlayer dielectric film is deposited next on the entire surface of a substrate. A surface of the interlayer dielectric film is flattened to expose an upper end of the silicon-nitride film mask by using a CMP (Chemical Mechanical Polishing) method. The silicon-nitride film mask is removed by dry etching or wet etching. As a result, a through-hole is formed in the interlayer dielectric film, and thus a conductive material is embedded into the through-holes, thereby forming the conductive layer.

According to the forming method of such a conductive layer, an area and position of a lower surface of the conductive layer match an area and position of an upper surface of the silicon pillars, respectively. Therefore, a contact resistance between the conductive layer and the silicon pillars is minimized. On the other hand, however, the forming method described above has a problem that a position margin (a contact margin) of a contact plug on the conductive layer becomes small. That is, according to the forming method, while silicon pillars are very thin in a highly-integrated semiconductor device, a thickness of the conductive layer cannot be larger than that of the silicon pillars, because the conductive layer is formed by embedding a conductive material into the through-hole formed by removing the silicon-nitride film mask. Accordingly, an area of the upper surface of the conductive layer becomes very small, and a contact margin of the contact plug on the conductive layer becomes small.

SUMMARY

In one embodiment, there is provided a semiconductor device comprising: a substrate; a first silicon pillar projecting substantially perpendicularly with respect to a main surface of the substrate; an interlayer dielectric film that covers the main surface of the substrate, the interlayer dielectric film having a through-hole into which a conductive material is buried, the through-hole having a lower-side opening that exposes an upper surface of the first silicon pillar and an upper side opening; a first diffusion layer formed in or neighboring an upper part of the first silicon pillar; a second diffusion layer formed in or neighboring a lower part of the first silicon pillar; a first-diffusion-layer contact plug provided on the upper-side opening of the through-hole so as to contact the conductive material within the through-hole; and a gate electrode that covers a side surface of the first silicon pillar via a first gate dielectric film, wherein an area of the lower-side opening of the through-hole is substantially equal to an area of the upper surface of the first silicon pillar, an area of the upper-side opening of the through-hole is larger than the area of the lower-side opening of the through-hole, and an area of a contact surface between the conductive material within the through-hole and the first-diffusion-layer contact plug is larger than the area of the upper surface of the first silicon pillar.

In another embodiment, there is provided a manufacturing method of a semiconductor device comprising: forming a mask pattern on a main surface of a silicon substrate, the mask pattern comprising a first insulation material and including a first sub-mask pattern corresponding to a formation position of a first silicon pillar and other sub-mask patterns; forming at least the first silicon pillar by etching the silicon substrate by using the mask pattern; covering the main surface with a first interlayer dielectric film comprising a second insulation material different from the first insulation material, while leaving at least the first sub-mask pattern; forming a through-hole in the first interlayer dielectric film, the through-hole including a space formed by removing the first sub-mask pattern and having a larger area of an upper-side opening than an area of an upper surface of the first silicon pillar; filling the through-hole with a conductive material; and forming a first-diffusion-layer contact plug in contact with an upper surface of the conductive material.

According to the present invention, the area of an upper surface (a surface connected to the first-diffusion-layer contact plug) of the conductive layer (a conductive material within a through-hole) formed in self-alignment can be made larger than the area of the upper surface of the first silicon pillar. Therefore, in forming the conductive layer in self-alignment, a relatively large contact margin of the first-diffusion-layer contact plug can be secured.

BRIEF DESCRIPTION OF THE DRAWINGS

The above features and advantages of the present invention will be more apparent from the following description of certain preferred embodiments taken in conjunction with the accompanying drawings, in which:

FIG. 1A is a schematic cross-sectional view, and FIG. 1B is a schematic plan view;

FIG. 3A is a cross-sectional view of the semiconductor device, and FIG. 3B is a plan view of the semiconductor device;

FIG. 4A is a cross-sectional view of the semiconductor device, and FIG. 4B is a plan view of the semiconductor device;

FIG. 5A is a cross-sectional view of the semiconductor device, and FIG. 5B is a plan view of the semiconductor device;

FIG. 13A is a cross-sectional view of the semiconductor device, and FIG. 13B is a plan view of the semiconductor device;

DETAILED DESCRIPTION OF THE PREFERRED EMBODIMENTS

Preferred embodiments of the present invention will now be explained in detail with reference to the drawings.

Figure 1A:
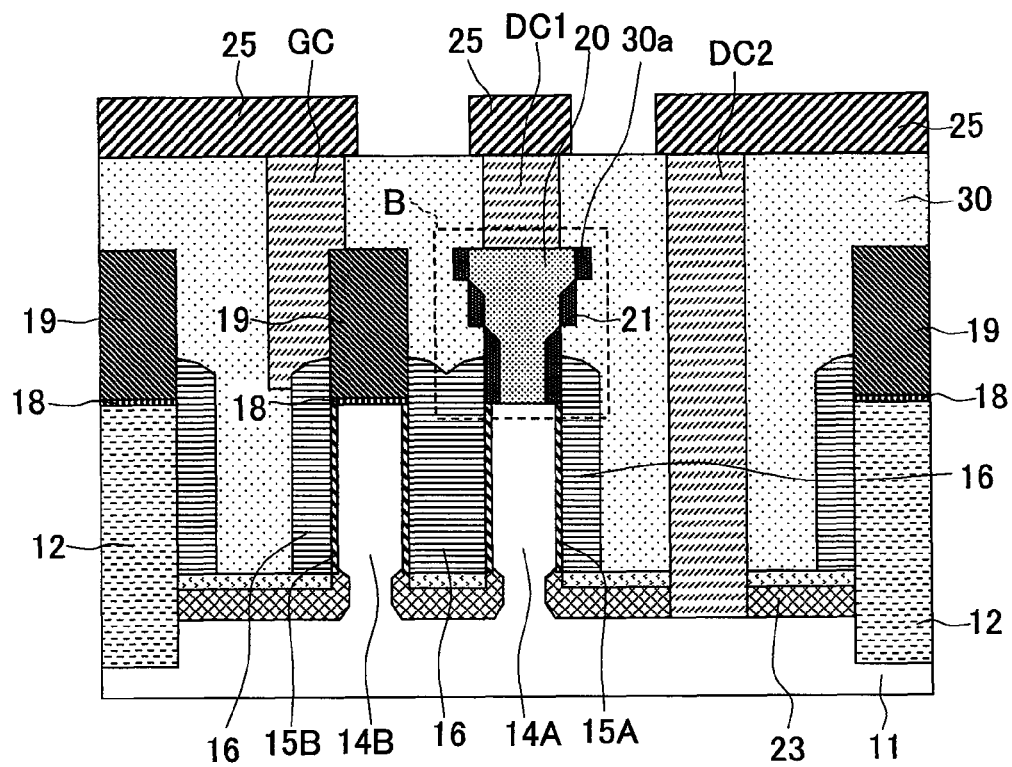
FIGS. 1A and 1B show a configuration of a semiconductor device according to the present embodiment, where
Figure 1B:
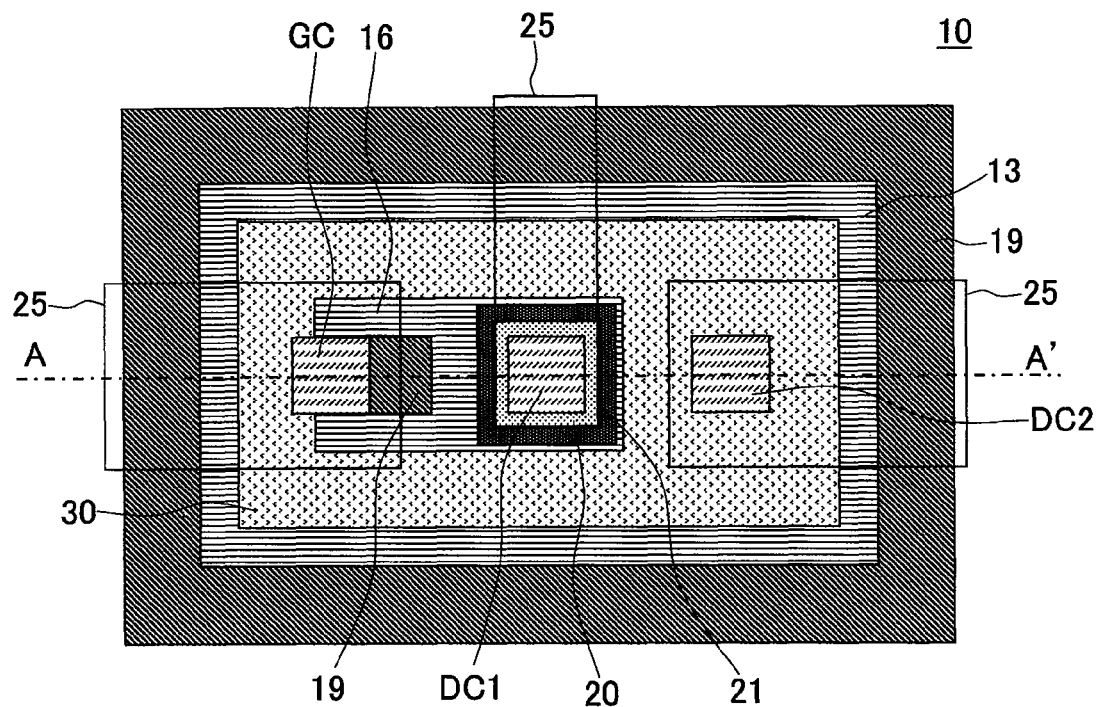
Figure 2:
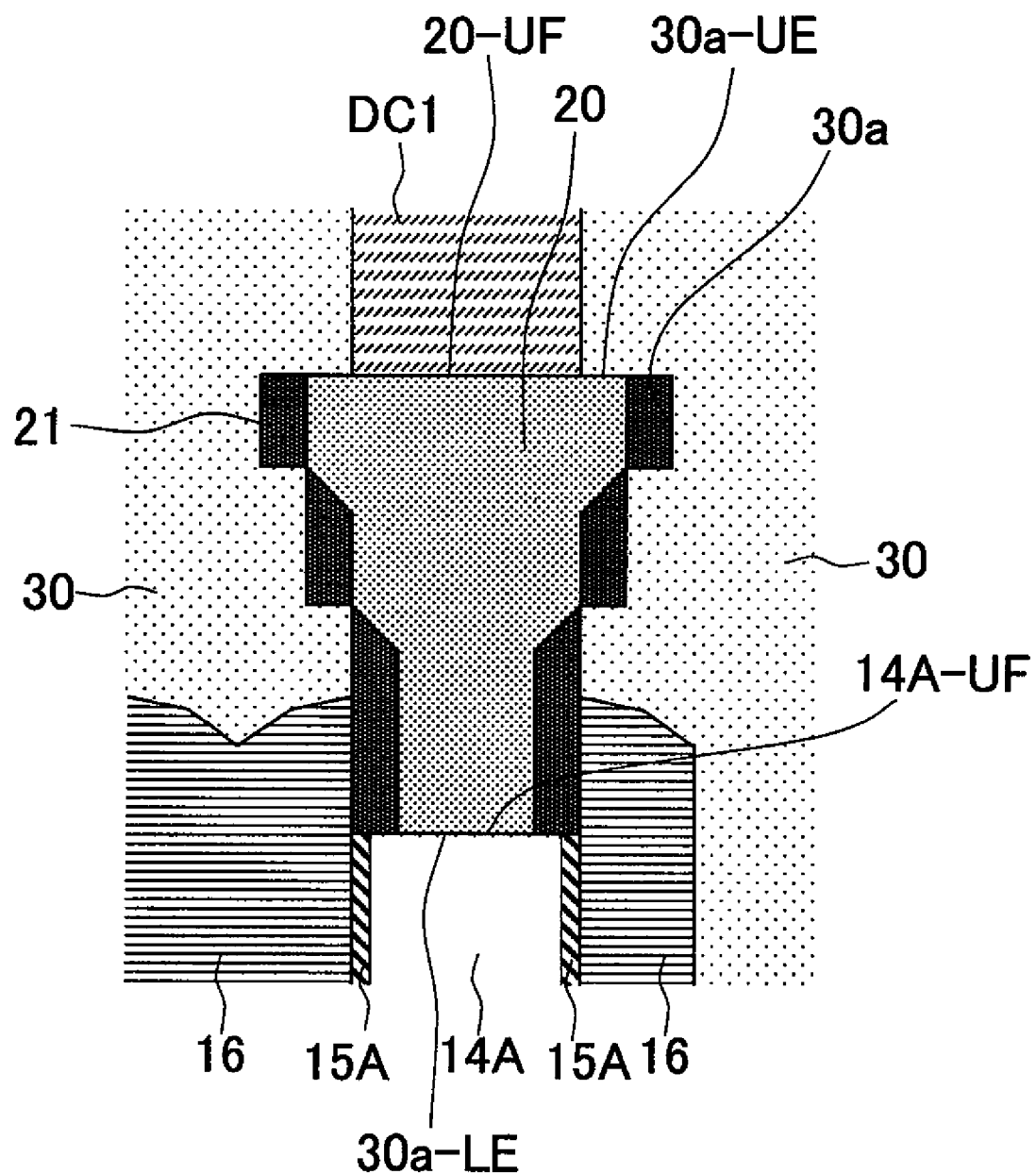
FIG. 2 is an enlarged view of a region B shown in FIG. 1A.
Figure 3A:
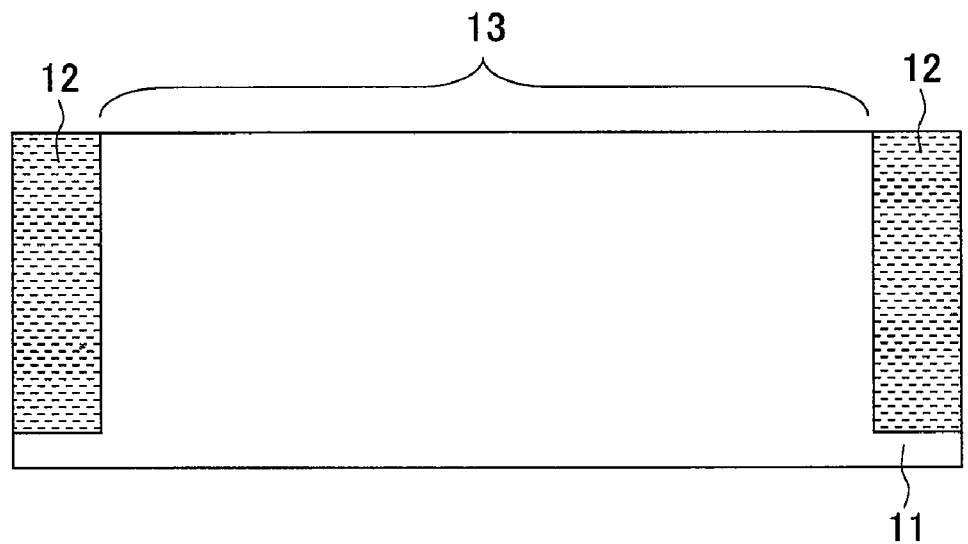
FIGS. 3A and 3B are process diagrams for explaining the manufacturing method of the semiconductor device according to the present embodiment, where
Figure 3B:
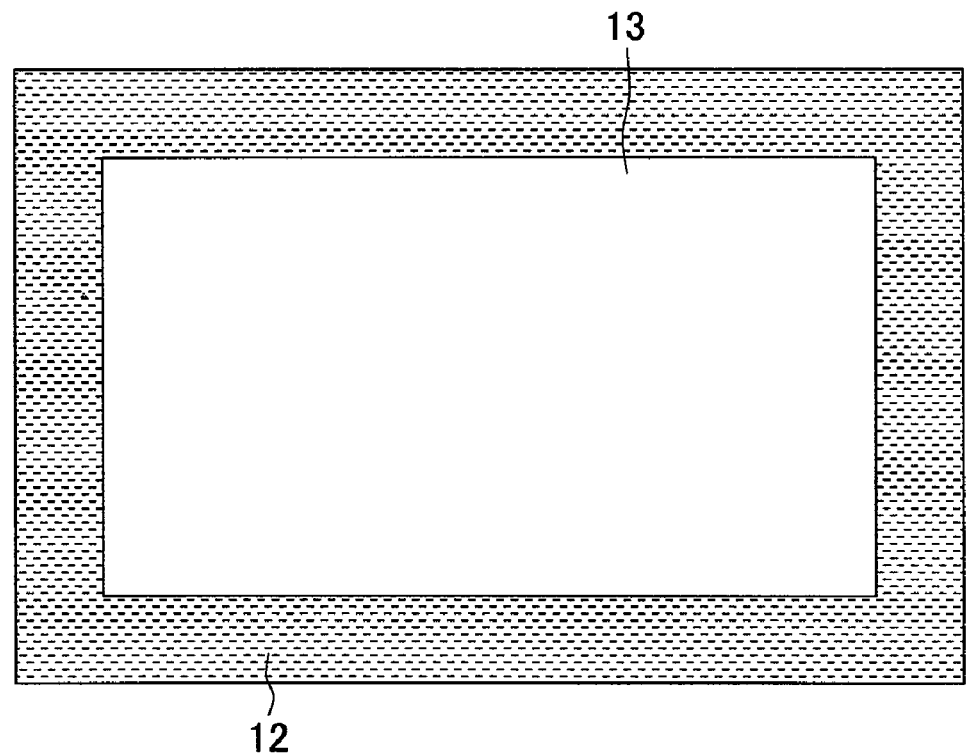

FIGS. 1A and 1B show a configuration of a semiconductor device 10 according to the present embodiment, where FIG. 1A is a schematic cross-sectional view, and FIG. 1B is a schematic plan view. FIG. 1A is a cross-sectional view along a line A-A' in FIG. 1B. FIG. 2 is an enlarged view of a region B shown in FIG. 1A.

As shown in FIGS. 1A and 1B, the semiconductor device according to the present embodiment includes an STI (Shallow Trench Isolation) 12 formed on a main surface of a silicon substrate 11, and first and second silicon-pillars 14A and 14B formed within a region (an active region 13) surrounded by the STI 12.

The semiconductor device 10 is a vertical transistor using silicon pillars, and is used for a cell transistor of a DRAM (Dynamic Random Access Memory), for example.

Both the first and second silicon pillars 14A and 14B are formed substantially perpendicularly with respect to a main surface of the silicon substrate 11. These silicon pillars are arranged adjacently, and an interval between these silicon pillars is set smaller than two times of a film thickness of a gate electrode 16 described later.

Sizes of the first and second silicon pillars 14A and 14B in a planar direction can be the same as shown in FIG. 1A, or can be different from each other. When sizes of these silicon pillars are set different, a size of the second silicon pillar 14B in a planar direction is preferably set larger than that of the first silicon pillar 14A. Specifically, it is preferable to set a planar dimension of the first silicon pillar 14A to about 70×70 nm, and set a planar dimension of the second silicon pillar 14B to about 100 nm×70 nm. With this arrangement, a first-diffusion-layer contact plug DC1 and a gate contact plug GC described later can be more separated from each other.

The height of each silicon pillar can be set according to required transistor characteristics. For example, when a planar dimension of the first silicon pillar 14A is 70 nm×70 nm, the height of each silicon pillar can be set to about 100 nm.

First and second gate dielectric films 15A and 15B are formed by thermal oxidation on side surfaces of the first and second silicon pillars 14A and 14B, respectively. The gate electrode 16 made of a polycrystalline silicon film in a predetermined film thickness is formed to surround external peripheries of the first and second gate dielectric films 15A and 15B. As described above, because the interval between the first and second silicon pillars 14A and 14B is set smaller than two times of a film thickness of the gate electrode 16, the gate electrode 16 at the external periphery of the first silicon pillar 14A and the gate electrode 16 at the external periphery of the second silicon pillar 14B are integrated to constitute one gate electrode 16.

A protection dielectric film (a silicon oxide film) 18 and a cap insulation film (a silicon nitride film) 19 used as a mask to form the silicon pillars remain without being removed, on an upper part of the second silicon pillar 14B. The protection dielectric film 18 and the cap insulation film 19 similarly remain on an upper part of the STI 12.

On the other hand, the protection dielectric film 18 and the cap insulation film 19 are removed from an upper part of the first silicon pillar 14A, and a first diffusion layer 20 is formed on the upper part of the first silicon pillar 14A. The first diffusion layer 20 is described in detail later.

A second diffusion layer 23 is formed on lower parts of the first and second silicon pillars 14A and 14B. The second diffusion layer 23 is formed in a flat region of the silicon substrate 11 in which no silicon pillars are formed, instead of in a region immediately below the first and second silicon pillars 14A and 14B.

The semiconductor device 10 further includes an interlayer dielectric film 30 made of a silicon oxide film that covers the main surface of the silicon substrate 11. A film thickness of the interlayer dielectric film 30 is set to exceed heights of the first diffusion layer 20 and the cap insulation film 19.

Three through-hole conductors including DC1 (the first-diffusion-layer contact plug), DC2 (a second-diffusion-layer contact plug), and GC (the gate contact plug) are formed in the interlayer dielectric film 30. Lower parts of these units are in contact with an upper surface of the first diffusion layer 20, the second diffusion layer 23, and an upper surface of the gate electrode 16, respectively. The gate contact plug GC is in contact with a part of a portion positioned at a periphery of the second silicon pillar 14B (a portion at the opposite side of the first silicon pillar 14A sandwiching the second silicon pillar 14B) of the upper surface of the gate electrode 16. Upper parts of the contact plugs DC1, DC2, and GC are connected to a wiring layer 25 formed on the interlayer dielectric film 30.

The contact plugs DC1, DC2, and GC are formed by filling a conductive material into contact holes piercing through the interlayer dielectric film 30. Polycrystalline silicon is preferably used for this conductive material.

The first diffusion layer 20 is formed in self-alignment by filling a conductive material into a through-hole 30a provided in the interlayer dielectric film 30. Poly crystalline silicon provided with arsenic ion-implantation and RTA (Rapid Thermal Annealing) is preferably used for the conductive material constituting the first diffusion layer 20.

The through-hole 30a has a so-called mortar-like shape as shown in FIG. 2. That is, as for a cross section being parallel to the main surface of the silicon substrate 11, a cross-sectional area of a cross section at a relatively higher position is equal to or larger than a cross-sectional area of a cross section at a relatively lower position.

The through-hole 30a, as described in detail later, is formed by expanding the space obtained by removing the protection dielectric film 18 and the cap insulation film 19 so that the cross-sectional area of a cross section at a relatively higher position is equal to or larger than the cross-sectional area of a cross section at a relatively lower position. Therefore, the through-hole 30a has a shape which includes a space obtained by removing the protection dielectric film 18 and the cap insulation film 19, and in which the cross-sectional area of a cross section at a relatively higher position is equal to or larger than the cross-sectional area of a cross section at a relatively lower position. Because the through-hole 30a has this shape, an area and position of a lower opening 30a-LE (FIG. 2) of the through-hole 30a match those of an upper surface 14A-UF of the first silicon pillar 14A. Accordingly, an area of an upper opening 30a-UE of the through-hole 30a is larger than the area of the upper surface 14A-UF of the first silicon pillar 14A.

A sidewall dielectric film 21 is formed on an inner wall of the through-hole 30a, and the conductive material constituting the first diffusion layer 20 is filled into a region surrounded by the sidewall dielectric film 21. A film thickness of the sidewall dielectric film 21 and the area of the upper opening 30a-UE of the through-hole 30a are set such that an area of an upper surface 20-UF of the first diffusion layer 20 is sufficiently larger than the area of the upper surface 14A-UF of the first silicon pillar 14A. The phrase "sufficiently larger" means that the area of the upper surface 20-UF of the first diffusion layer 20 is increased to a level capable of sufficiently securing a contact margin of the first-diffusion-layer contact plug DC1 relative to the first diffusion layer 20 (a permissible amount of a positional deviation of the first-diffusion-layer contact plug DC1).

In the semiconductor device 10 having the configuration described above, the first silicon pillar 14A functions as a transistor. The first diffusion layer 20 functions as one of a source and a drain region. The second diffusion layer 23 functions as the other one of the source and the drain region. The source, the drain, and the gate of the transistor are drawn to the wiring layer 25 by the contact plugs DC1, DC2, and GC.

On/off control of the transistor is performed by an electric field given to the gate electrode 16 through the gate contact plug GC. A channel is formed within the first silicon pillar 14A positioned between the first diffusion layer 20 and the second diffusion layer 23.

The second silicon pillar 14B is a dummy pillar provided to form the gate contact plug GC, and does not function as a transistor. By providing the second silicon pillar 14B, a gate electrode configuration requiring no photolithography to form a flat portion of the gate electrode 16 is achieved.

As explained above, according to the semiconductor device 10, a larger area can be obtained for the upper surface of the first diffusion layer 20 formed in self-alignment than the area of the upper surface of the first silicon pillar 14A. Therefore, in forming the first diffusion layer 20 in self-alignment, a relatively large contact margin of the first-diffusion-layer contact plug DC1 can be obtained.

A manufacturing method of the semiconductor device 10 according to the present embodiment is explained in detail next.

FIGS. 3A and 3B to FIG. 22 are process diagrams for explaining the manufacturing method of the semiconductor device 10 according to the present embodiment. The diagrams denoted with "A" are cross-sectional views, and those denoted with "B" are plan views.

In manufacturing the semiconductor device 10, the silicon substrate 11 is first prepared. The STI 12 is formed in the surface of the silicon substrate 11, thereby forming the active region 13 surrounded by the STI 12 (see FIGS. 3A and 3B). Although many active regions are actually formed on the silicon substrate 11, only one active region is shown in the drawings. Although a shape of the active regions is not particularly limited, the active region 13 has a rectangular shape in the embodiment.

The STI 12 is formed in the following order. A trench having a depth of about 220 nm is formed by dry etching on the main surface of the silicon substrate 11. A thin silicon oxide film is formed on the entire surface of the substrate including an inner wall of the trench, by thermal oxidation at about 1000° C. A silicon oxide film having a thickness of 400 to 500 nm is deposited on the entire surface of the substrate including the inside of the trench, by an HDP (High Density Plasma) method. An unnecessary silicon oxide film on the silicon substrate 11 is removed by CMP, and the silicon oxide film is left only within the trench, thereby forming the STI 12.

Figure 4A:
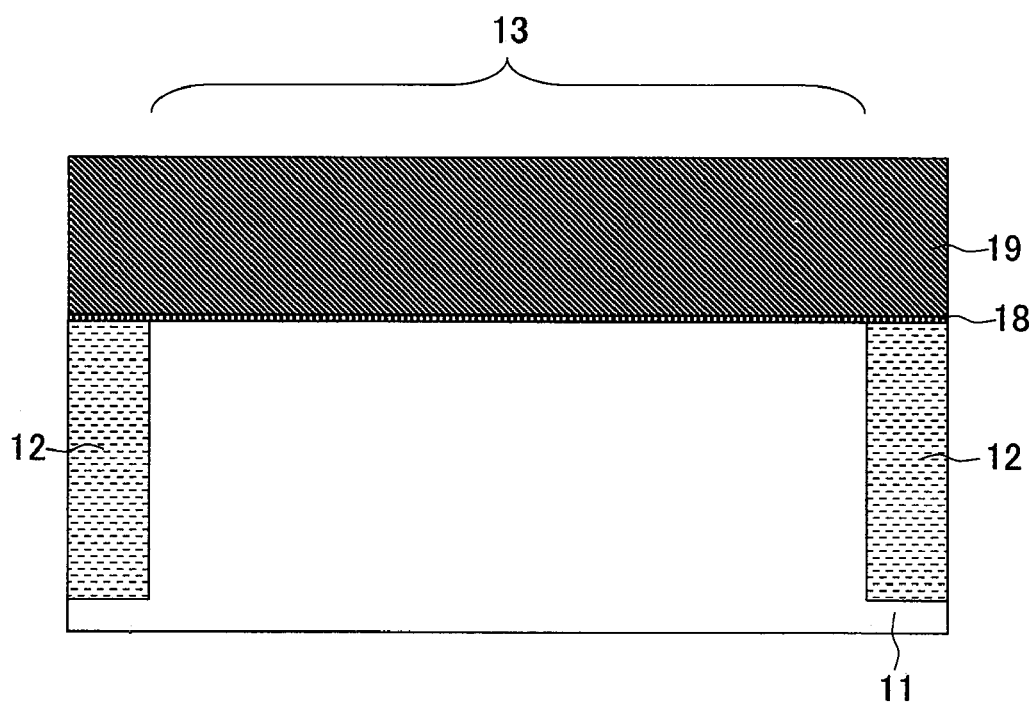
FIGS. 4A and 4B are process diagrams for explaining the manufacturing method of the semiconductor device according to the present embodiment, where
Figure 4B:
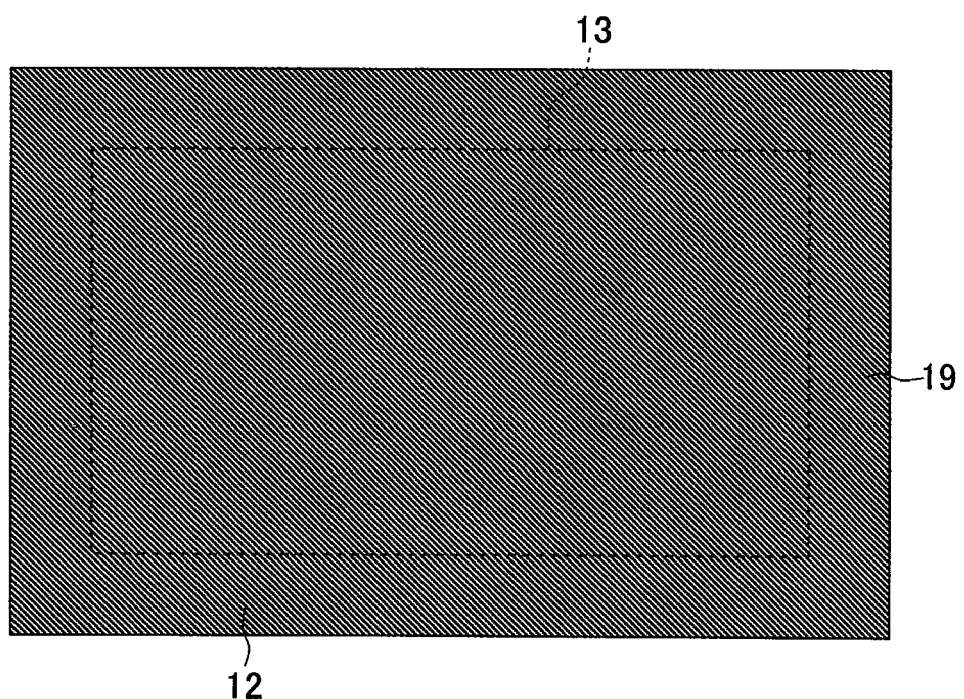

The first and second silicon pillars 14A and 14B are formed simultaneously within the active region 13. In forming the silicon pillars 14A and 14B, the silicon oxide film 18 being a protective insulation film is first formed on the entire surface of the silicon substrate 11. The insulation film 19 made of a first insulation material is formed on the silicon oxide film 18 (FIGS. 4A and 4B). A silicon nitride film is preferably used for the first insulation material. The following explanations are based on an assumption that the first insulation material is a silicon nitride film. While not particularly limited, it is preferable that the silicon oxide film 18 can be formed by thermal oxidation, the insulation film 19 can be formed by a CVD (Chemical Vapor Deposition) method, the silicon oxide film 18 has a film thickness of about 5 nm, and the insulation film 19 has a film thickness of about 120 nm.

Figure 5A:
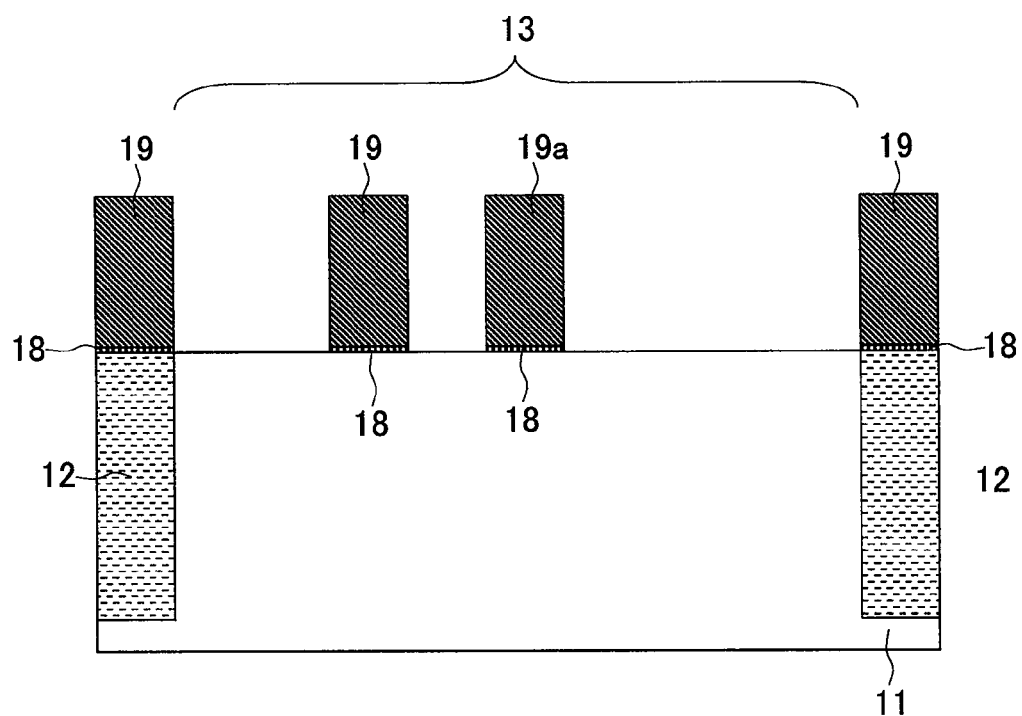
FIGS. 5A and 5B are process diagrams for explaining the manufacturing method of the semiconductor device according to the present embodiment, where
Figure 5B:
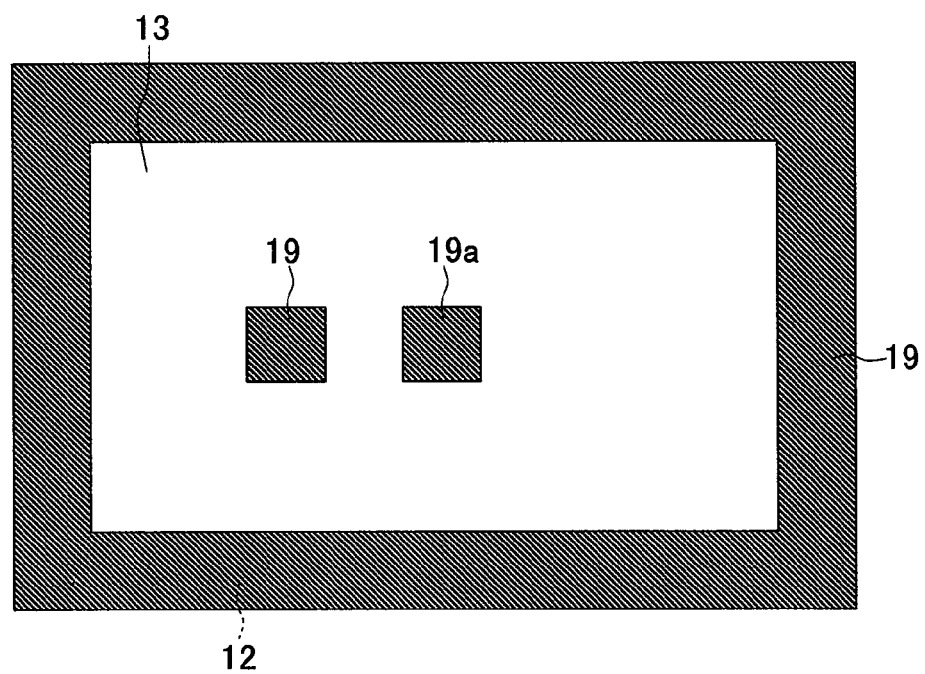

Thereafter, by patterning the dielectric film 19, a mask pattern including sub-mask patterns corresponding to formation positions of the first and second silicon pillars 14A and 14B and the STI 12, respectively is formed (FIGS. 5A and 5B). In the following explanations, the insulation film 19 corresponding to a formation position of the silicon pillar 14A is called an insulation film 19a in distinction from other films. When this patterning is performed, the silicon oxide film 18 can be also similarly patterned as shown in FIG. 5A. An edge of the insulation film 19 that covers the STI 12 can be positioned at slightly outside of an external periphery of the active region 13 to avoid formation of an unnecessary silicon pillar within the active region 13.

Figure 6:
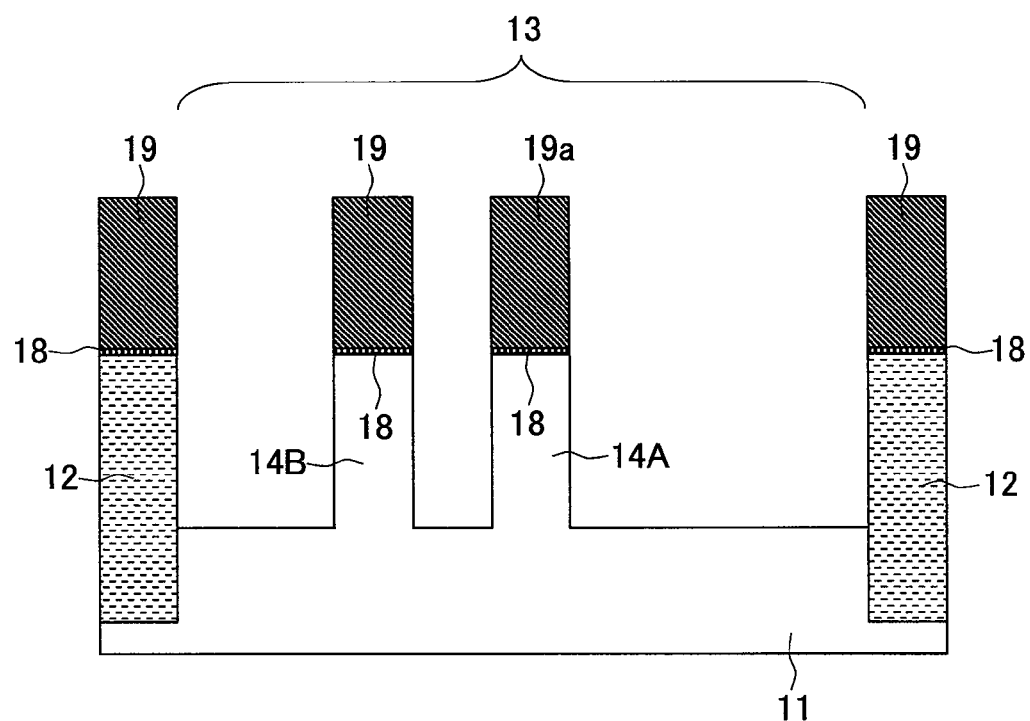
FIG. 6 is a process diagram for explaining the manufacturing method of the semiconductor device according to the present embodiment and is a plan view of the semiconductor device.

An exposed surface of the active region 13 is etched deeper by dry etching using the mask patterned in this way (FIG. 6). The first and second silicon pillars 14A and 14B are formed substantially perpendicularly with respect to the main surface of the silicon substrate 11 by this etching process. The insulation film 19 which remains becomes the cap insulation film that covers the upper side of the silicon pillar and the like.

Figure 7:
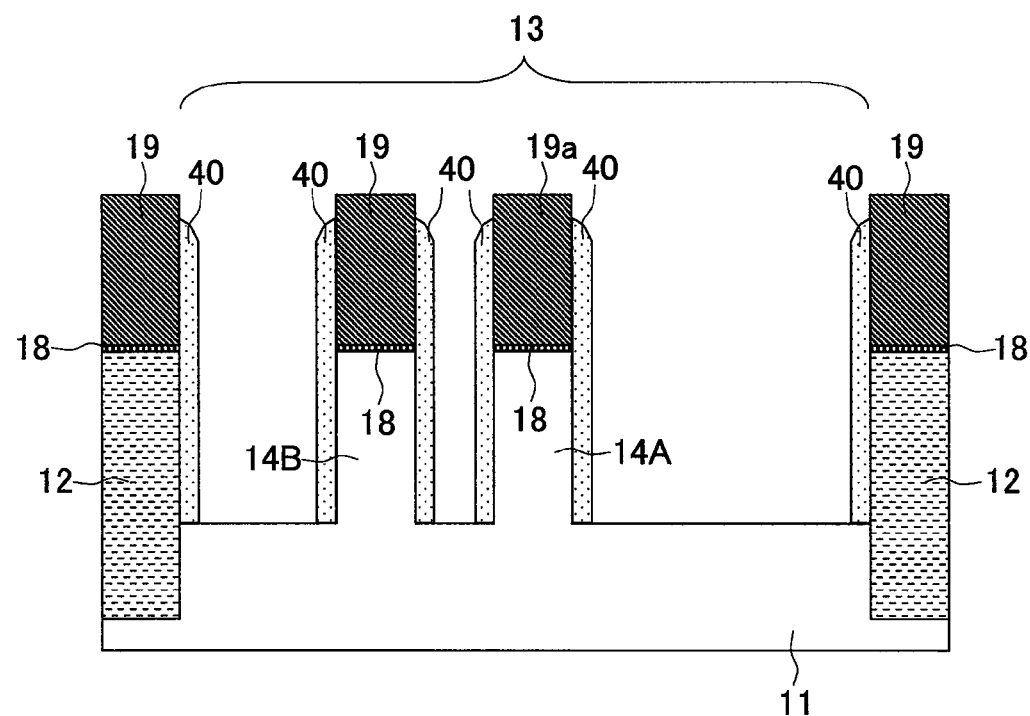
FIG. 7 is a process diagram for explaining the manufacturing method of the semiconductor device according to the present embodiment and is a plan view of the semiconductor device.

A sidewall dielectric film 40 is then formed on the side surfaces of the first and second silicon pillars 14A and 14B (FIG. 7). The sidewall dielectric film 40 is formed as follows. The exposed surface of the active region 13 is protected by thermal oxidation while leaving the dielectric film 19, and thereafter, a silicon nitride film is formed. This silicon nitride film is etched back, thereby forming the sidewall dielectric film 40. With this arrangement, the external peripheral surface of the active region 13 (an internal peripheral surface of the STI 12) and the side surfaces of the first and second silicon pillars 14A and 14B are covered by the sidewall dielectric film 40.

Figure 8:
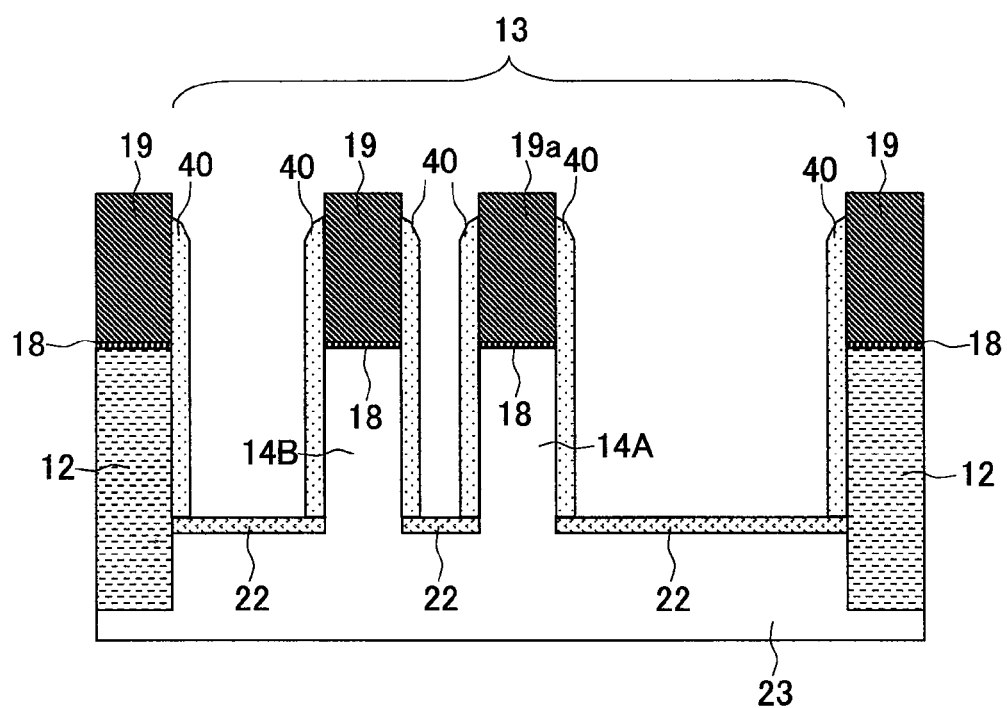
FIG. 8 is a process diagram for explaining the manufacturing method of the semiconductor device according to the present embodiment and is a plan view of the semiconductor device.

A silicon oxide film 22 is then formed by thermal oxidation on the exposed surface of the active region 13 (that is, a bottom surface of the active region 13) (FIG. 8). In this case, the upper surfaces and the side surfaces of the first and second silicon pillars 14A and 14B are not thermally oxidized because these surfaces are covered by the cap insulation film 19 and the sidewall dielectric film 40, respectively. While not particularly limited, it is preferable that the silicon oxide film 22 has a film thickness of about 30 nm.

Figure 9:
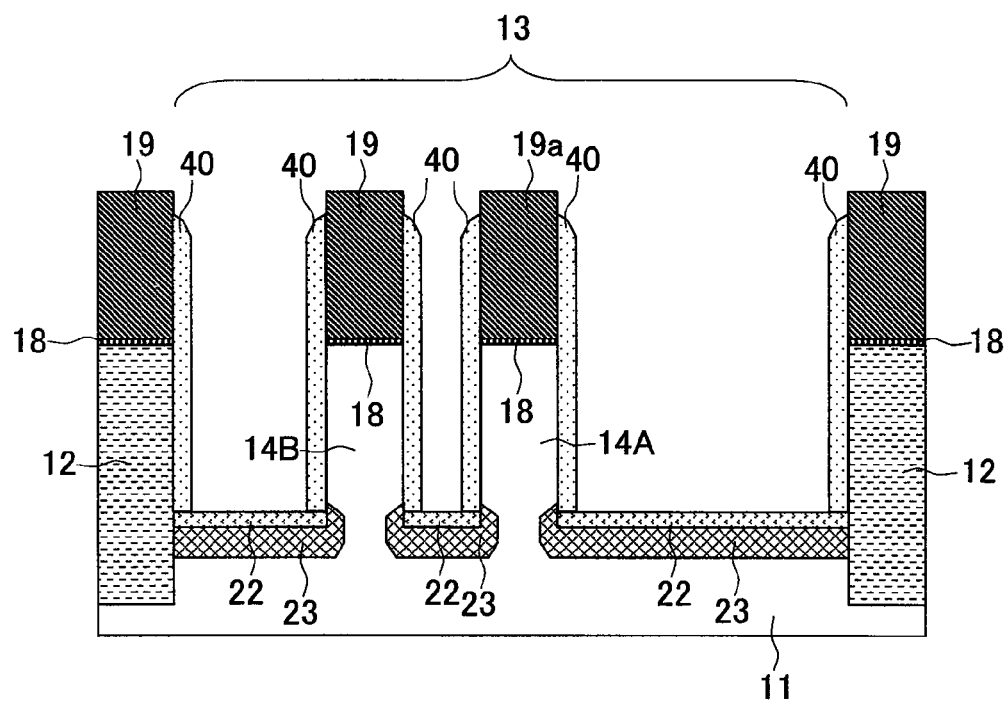
FIG. 9 is a process diagram for explaining the manufacturing method of the semiconductor device according to the present embodiment and is a plan view of the semiconductor device.

The second diffusion layer 23 is then formed on the lower parts of the first and second silicon pillars 14A and 14B, respectively (FIG. 9). The second diffusion layer 23 is formed by ion-implanting an impurity having a conduction type opposite to that of an impurity in the silicon substrate 11 via the silicon oxide film 22 formed on the surface of the active region 13.

Figure 10:
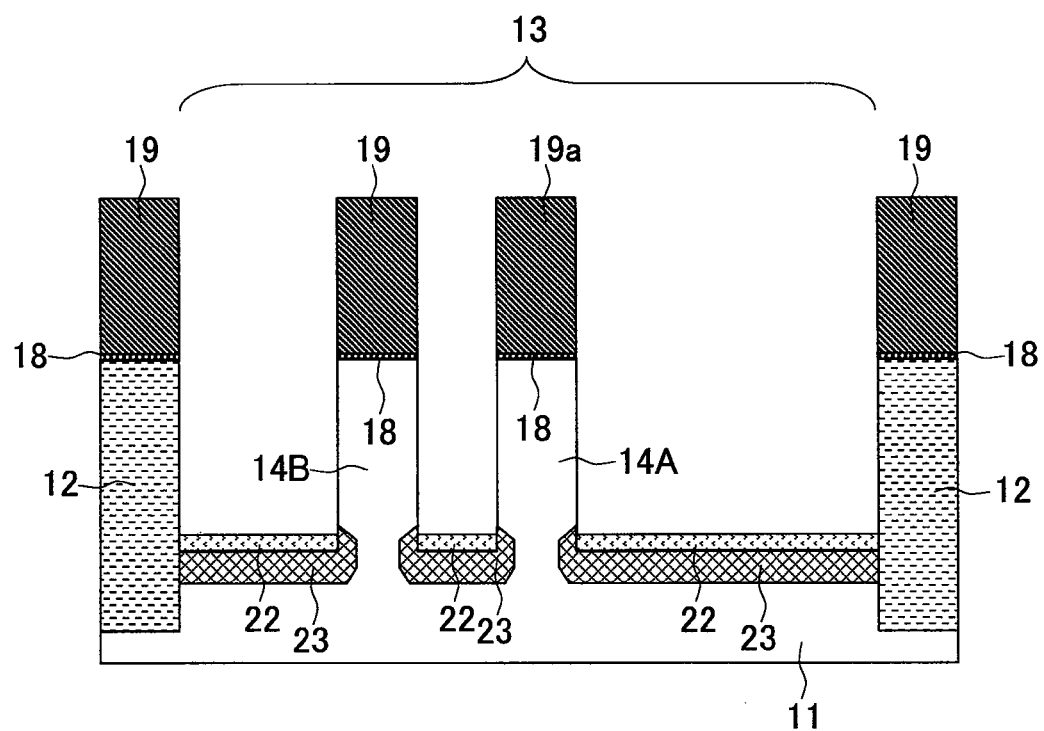
FIG. 10 is a process diagram for explaining the manufacturing method of the semiconductor device according to the present embodiment and is a plan view of the semiconductor device.

The sidewall dielectric film 40 is then removed by wet etching (FIG. 10). With this arrangement, a side surface of the silicon oxide film 22 formed on the bottom surface of the active region 13 and the side surfaces of the first and second silicon pillars 14A and 14B are exposed. The upper surfaces of the first and second silicon pillars 14A and 14B are kept covered by the cap insulation film 19.

Figure 11:
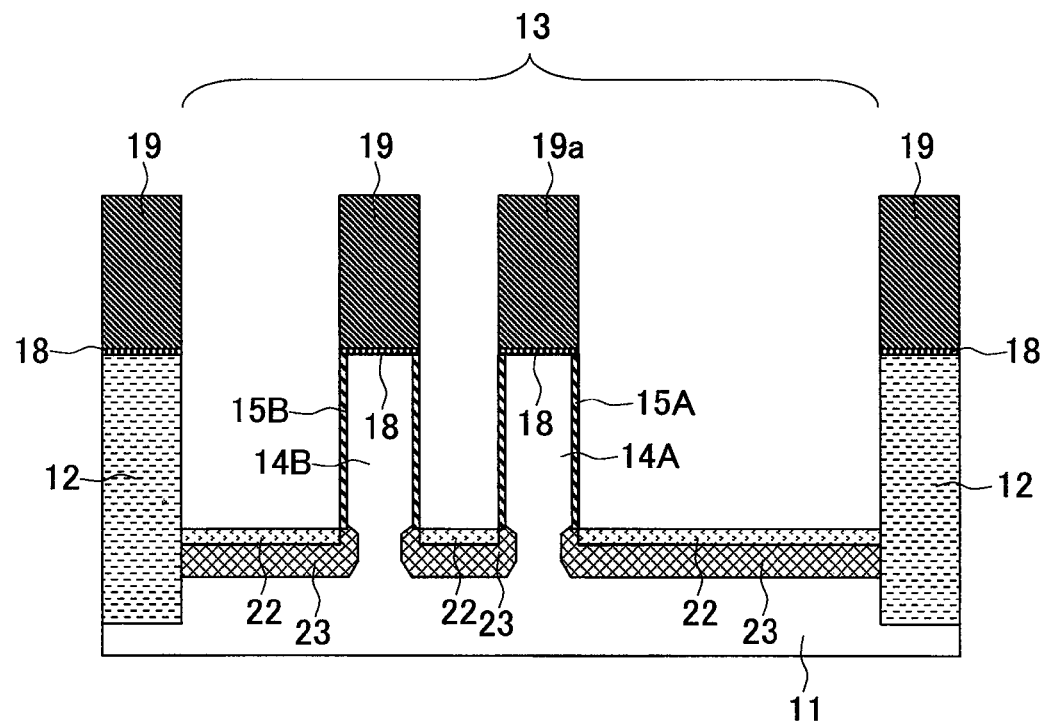
FIG. 11 is a process diagram for explaining the manufacturing method of the semiconductor device according to the present embodiment and is a plan view of the semiconductor device.
Figure 12:
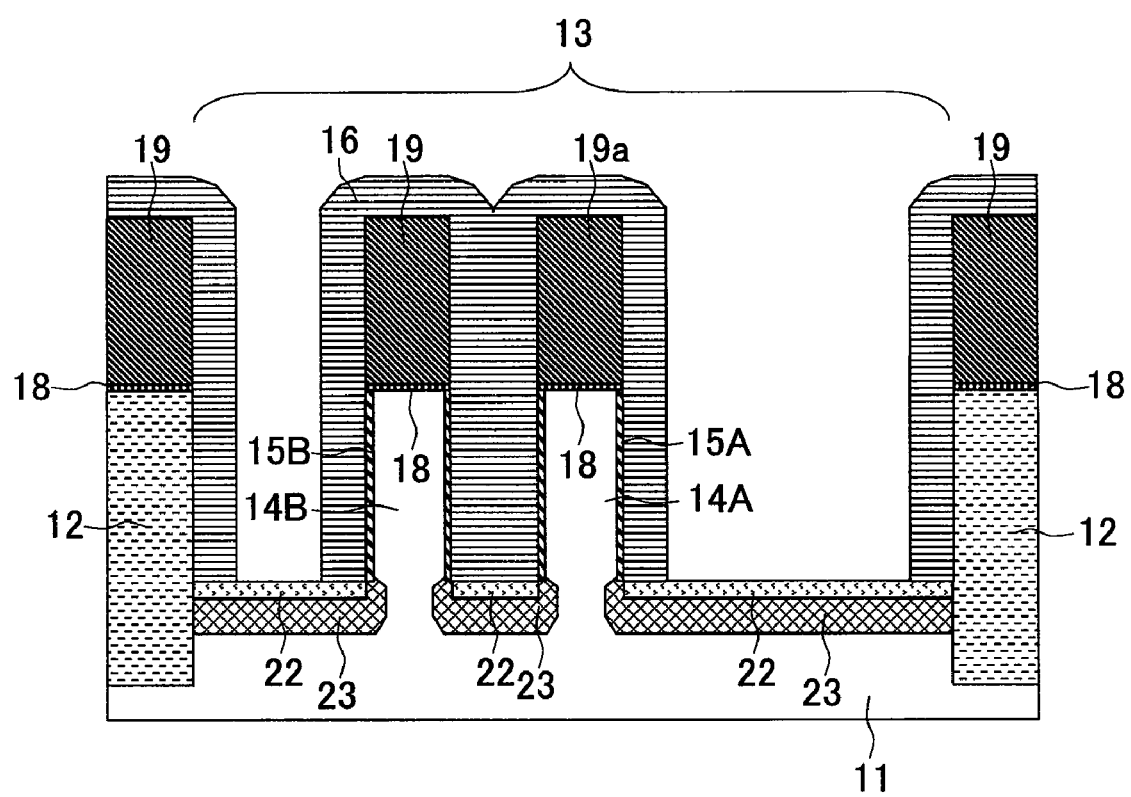
FIG. 12 is a process diagram for explaining the manufacturing method of the semiconductor device according to the present embodiment and is a plan view of the semiconductor device.

The first and second gate dielectric films 15A and 15B are then formed simultaneously on the side surfaces of the first and second silicon pillars 14A and 14B, respectively (FIG. 11). The gate dielectric films 15A and 15B can be formed by thermal oxidation, and preferably have a film thickness of about 5 nm, respectively.

Figure 13A:
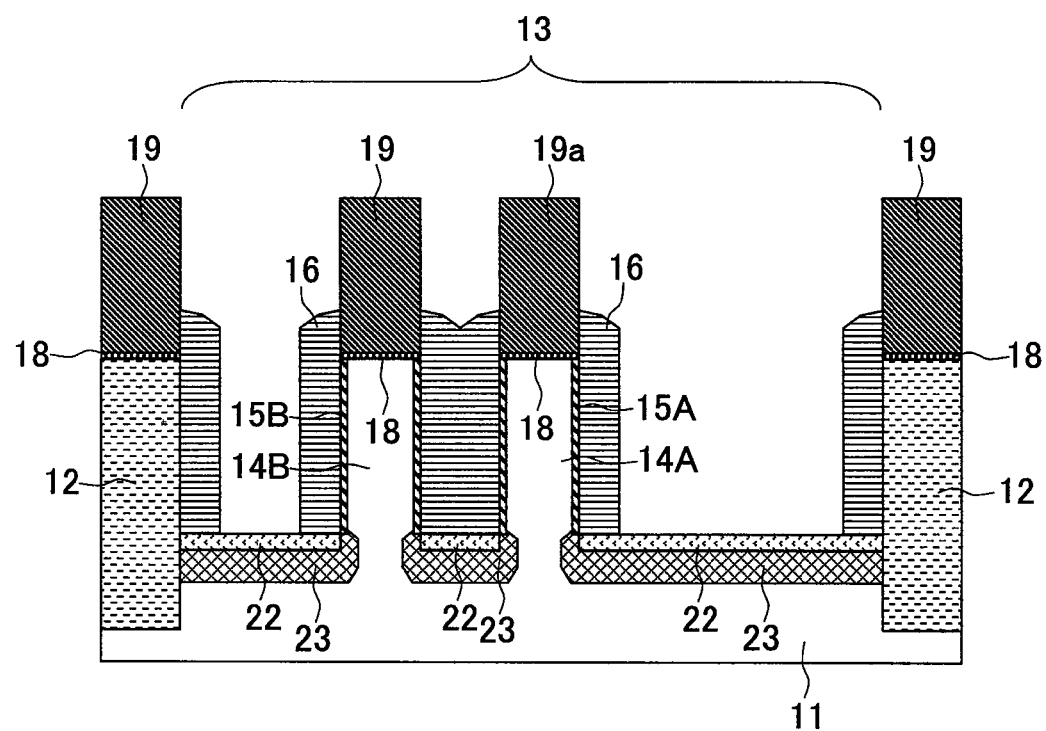
FIGS. 13A and 13B are process diagrams for explaining the manufacturing method of the semiconductor device according to the present embodiment, where
Figure 13B:
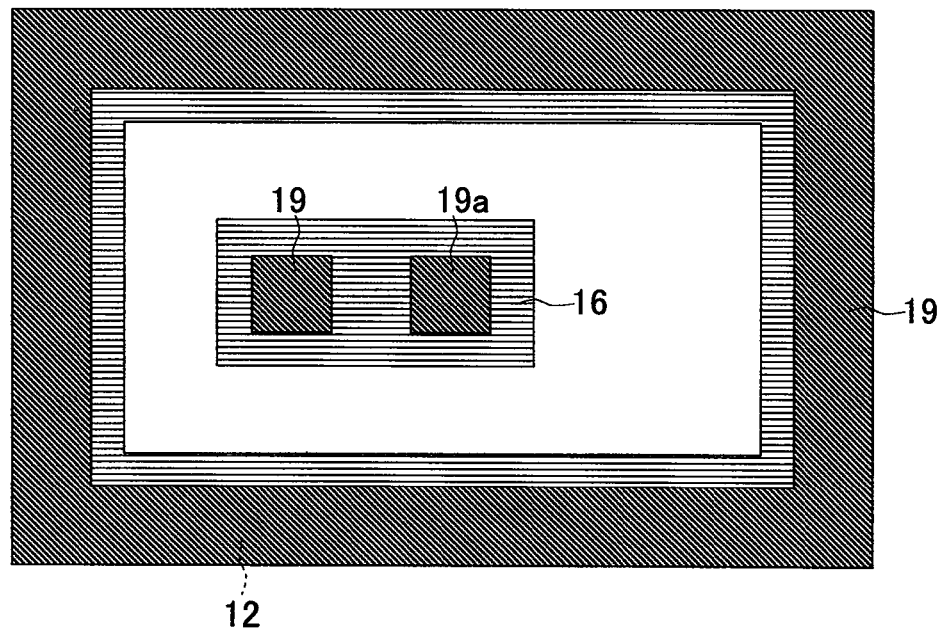

The gate electrode 16 made of a polycrystalline silicon film is then formed. The gate electrode 16 is formed by forming a polycrystalline silicon film having a film thickness of about 30 nm on the entire surface of the substrate by the CVD method (FIG. 12), and by etching back the polycrystalline silicon film (FIGS. 13A and 13B). As a result, the side surfaces of the silicon pillars 14A and 14B are covered by the gate electrode 16. Although a polycrystalline silicon film remains on the side surface of the STI 12, this polycrystalline silicon film does not function as a gate electrode. Because the interval between the first and second silicon pillars 14A and 14B is set smaller than two times of the film thickness of the gate electrode 16, as described above, the gate electrode 16 formed on the side surface of the first silicon pillar 14A and the gate electrode 16 formed on the side surface of the second silicon pillar 14B are in contact with each other at an interface between the first and second silicon pillars 14A and 14B, and are integrated.

Figure 14:
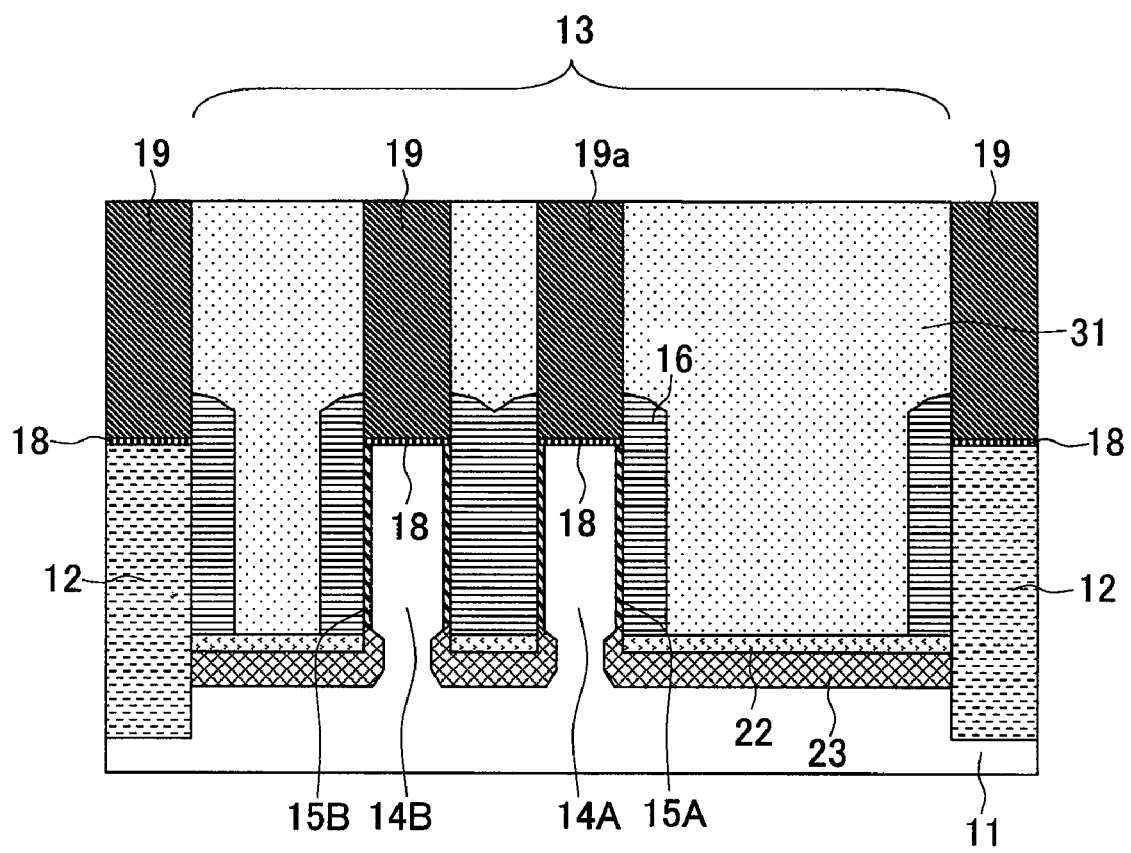
FIG. 14 is a process diagram for explaining the manufacturing method of the semiconductor device according to the present embodiment and is a plan view of the semiconductor device.

A first interlayer-dielectric film 31 made of a second insulation material is then formed on the entire surface of the silicon substrate 11. The second insulation material is different from the first insulation material, and is preferably a silicon oxide film. The following explanations are based on an assumption that the first insulation material is a silicon nitride film. A film thickness of the first interlayer-dielectric film 31 is set to exceed the height of the cap insulation film 19. Thereafter, a surface of the first interlayer-dielectric film 31 is polished and flattened by the CMP method (FIG. 14). Because the cap insulation film 19 made of a silicon nitride film works as a CMP stopper in this case, a film thickness of the first interlayer-dielectric film 31 can be securely controlled. The inside of the active region 13 is embedded with the first interlayer-dielectric film 31 in this way, and an upper surface of the cap insulation film 19 is exposed.

Figure 15:
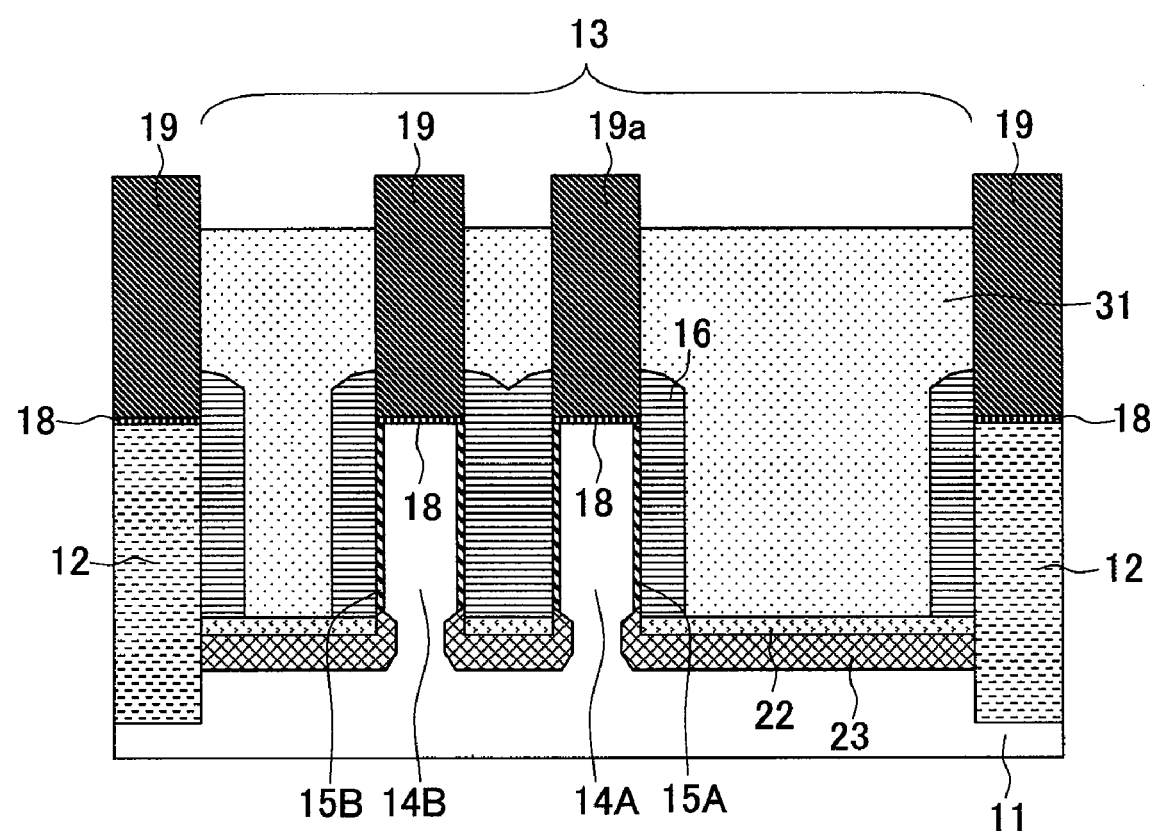
FIG. 15 is a process diagram for explaining the manufacturing method of the semiconductor device according to the present embodiment and is a plan view of the semiconductor device.

Next, the first interlayer-dielectric film 31 is etched back by about 20 nm, thereby projecting an upper end of the cap insulation film 19 (FIG. 15). A selective oxide-film wet etching using rare hydrofluoric acid is used for this etching back.

Figure 16:
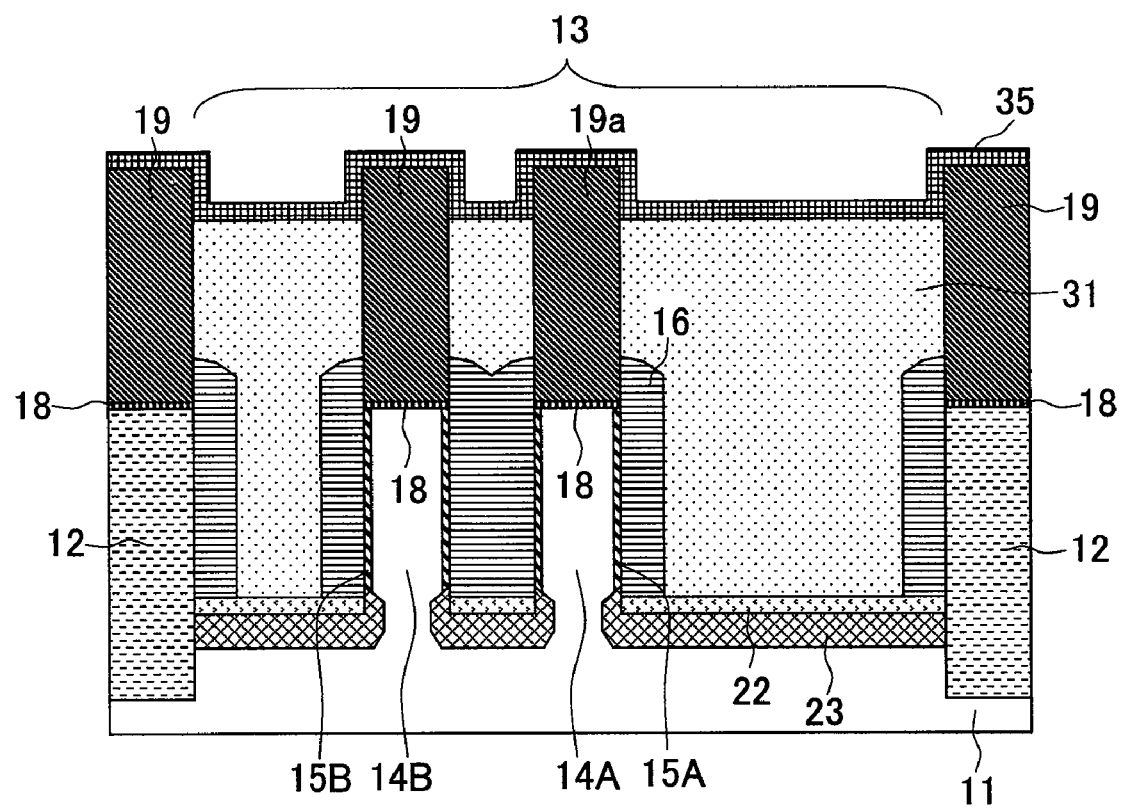
FIG. 16 is a process diagram for explaining the manufacturing method of the semiconductor device according to the present embodiment and is a plan view of the semiconductor device.

The first insulation material (a silicon nitride film, in this case) is then deposited by an LP (Low Pressure)-CVD method, thereby forming a diameter-expansion dielectric film 35 (FIG. 16). The diameter-expansion dielectric film 35 can be a very thin film having a film thickness of about 10 nm.

Figure 17:
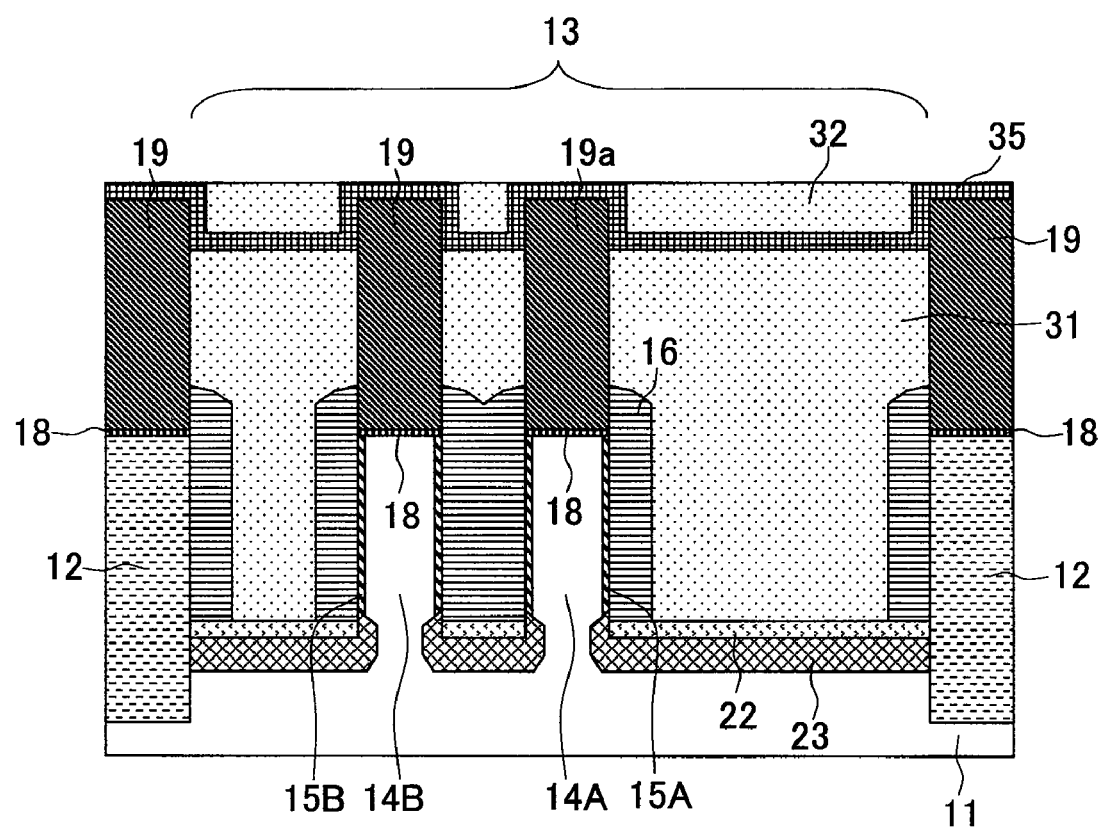
FIG. 17 is a process diagram for explaining the manufacturing method of the semiconductor device according to the present embodiment and is a plan view of the semiconductor device.
Figure 18:
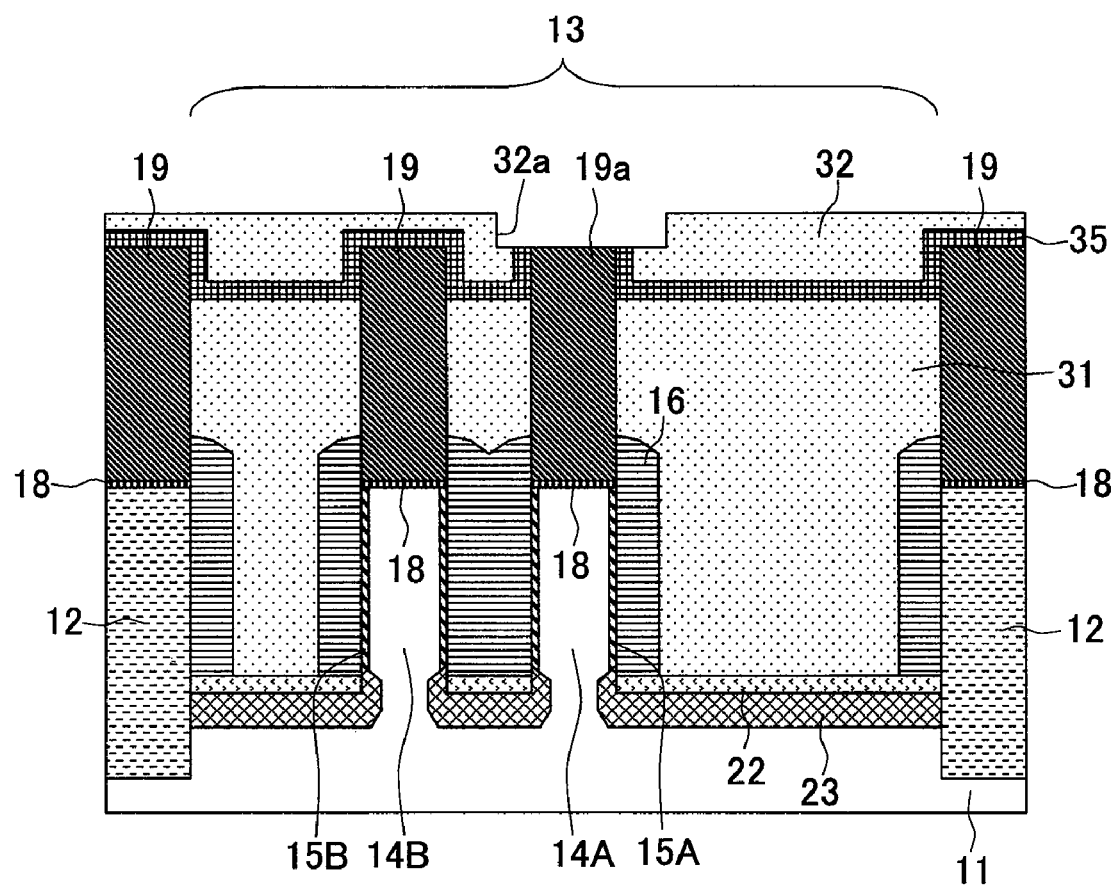
FIG. 18 is a process diagram for explaining the manufacturing method of the semiconductor device according to the present embodiment and is a plan view of the semiconductor device.

Next, the second insulation material (a silicon oxide film, in this case) is deposited by using HDP. The deposited second insulation material is once flattened to expose an upper surface of the diameter-expansion dielectric film 35 by CMP (FIG. 17). The second insulation material is further deposited, thereby forming a second interlayer dielectric film 32. Thereafter, an opening 32a to expose an upper surface of the insulation film 19a is provided on the second interlayer dielectric film 32 by lithography and by anisotropic dry etching (FIG. 18). In this case, the etching can be performed to leave the diameter-expansion dielectric film 35 deposited on the upper surface of the insulation film 19a.

The positioning accuracy of the opening 32a does not need to be very high at this stage. An object of forming the second interlayer dielectric film 32 that completely covers the upper surface of the diameter-expansion dielectric film 35 and providing the opening 32a on the second interlayer dielectric film 32 is to make it possible to remove the insulation film 19a and the diameter-expansion dielectric film 35 near the insulation film 19a and to avoid removing other insulation film 19 and the diameter-expansion dielectric film 35 near this other insulation film 19 in a process described later. Therefore, it suffices that the opening 32a is formed such that at least the insulation film 19a and the diameter-expansion dielectric film 35 near the insulation film 19a are exposed and that other insulation film 19 and the diameter-expansion dielectric film 35 near the other insulation film 19 are not exposed. Therefore, any remarkably high positioning accuracy is not required.

Figure 19:
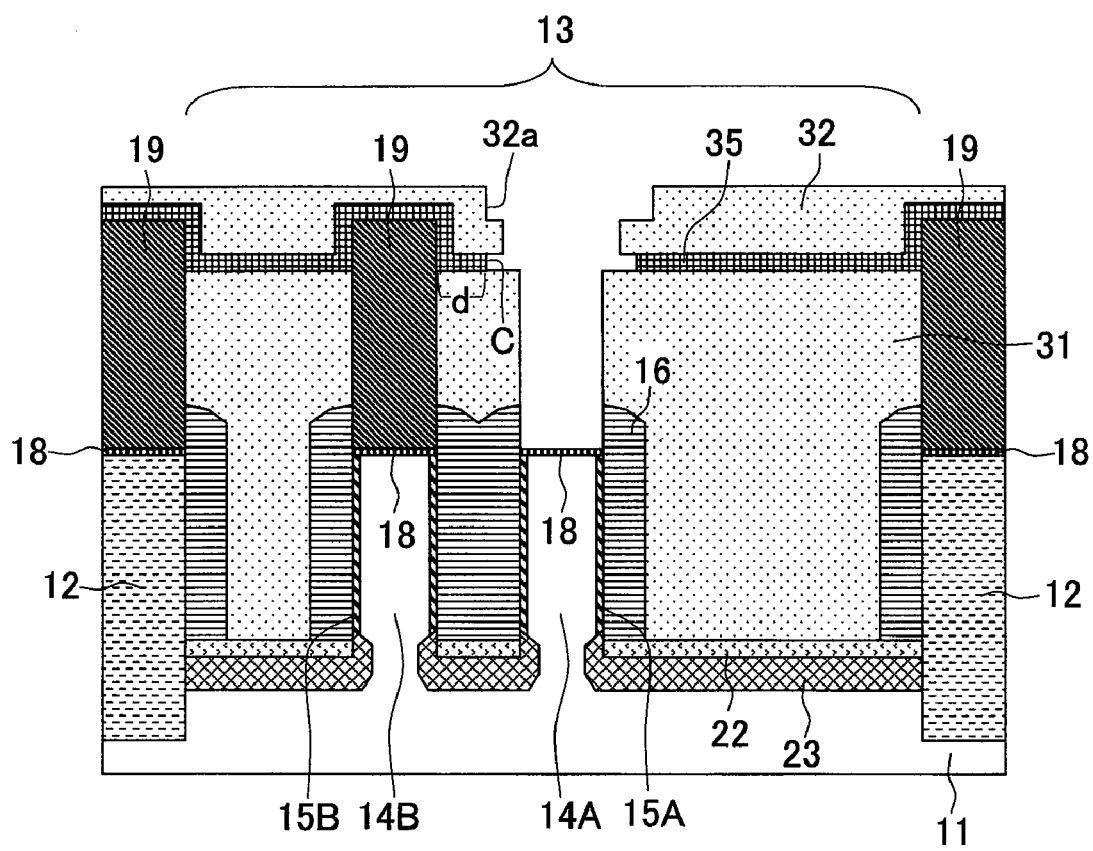
FIG. 19 is a process diagram for explaining the manufacturing method of the semiconductor device according to the present embodiment and is a plan view of the semiconductor device.

A nitride-film wet etching is then performed by thermal phosphoric acid through the opening 32a, thereby removing the insulation film 19a (FIG. 19). In this case, the diameter-expansion dielectric film 35 near the insulation film 19a is also removed at the same time. The thermal phosphoric acid also continues to etch the diameter-expansion dielectric film 35 in a lateral direction. However, an etching progress level in the lateral direction can be adjusted by an etching time and by a film thickness of the diameter-expansion dielectric film 35. That is, when the diameter-expansion dielectric film 35 has a very small film thickness of about 10 nm, infiltration of thermal phosphoric acid to a lateral direction can be prevented. Because it takes a long time to etch in a lateral direction, a progress level of the etching in the lateral direction can be controlled by adjusting the etching time. Because easiness of infiltration of thermal phosphoric acid to a lateral direction can be controlled by adjusting a film thickness of the diameter-expansion dielectric film 35, a progress level of the etching in a lateral direction can be also controlled by a film thickness of the diameter-expansion dielectric film 35. However, because the diameter-expansion dielectric film 35 is also used as a mask to perform anisotropic dry etching described later, the diameter-expansion dielectric film 35 needs to have a certain film thickness (equal to or above 7 nm). A detailed progress level of etching in the lateral direction is preferably a level (exceeding 0 nm) capable of securing a distance d between an etching end C (FIG. 19) in a lateral direction and the cap insulation film 19 on the adjacent silicon pillar 14B.

Figure 20:
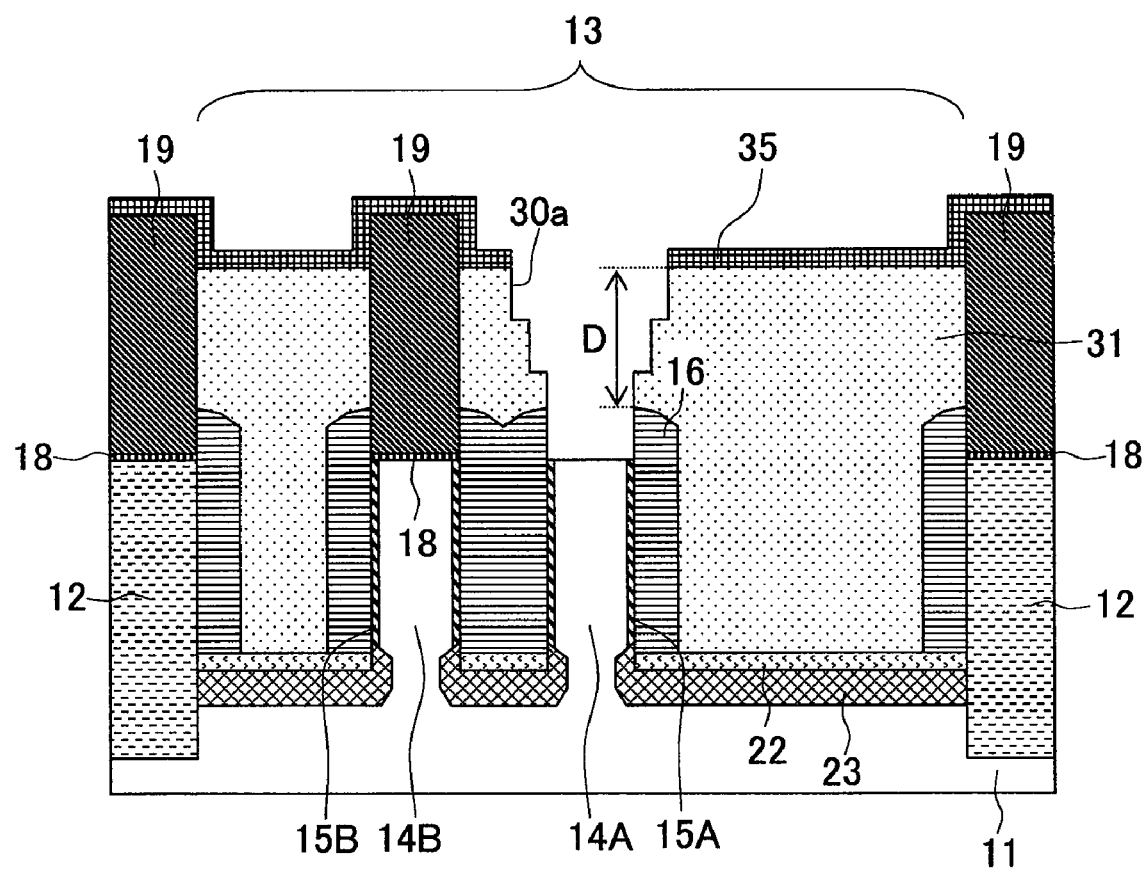
FIG. 20 is a process diagram for explaining the manufacturing method of the semiconductor device according to the present embodiment and is a plan view of the semiconductor device.

The first and second interlayer dielectric films 31 and 32 are then etched by selective anisotropic dry etching (FIG. 20). This etching is performed by introducing $C_4F_6$ gas of 18 sccm, $O_2$ gas of 20 sccm, and Ar gas of 1000 sccm under a pressure of 40 mTorr, by using a commercially available 2-cycle parallel plate RIE (Reactive Ion Etching) device. An etching amount is smaller than a difference (a length shown by reference letter D in FIG. 20) between the height of the diameter-expansion dielectric film 35 and the height of the gate electrode 16.

As a result of the anisotropic dry etching described above, the second interlayer dielectric film 32 is completely removed. On the other hand, the through-hole 30a described above having a mortar-like shape is formed in self-alignment on the first interlayer dielectric film 31. The protection dielectric film 18 formed on the upper surface of the first silicon pillar 14A is also removed by the anisotropic dry etching. Accordingly, the upper surface of the first silicon pillar 14A is exposed on a bottom surface of the through-hole 30a. A center of the through-hole 30a formed in this way and a center of the first silicon pillar 14A match each other as viewed planarly. This is because the through-hole 30a is formed in self-alignment.

Figure 21:
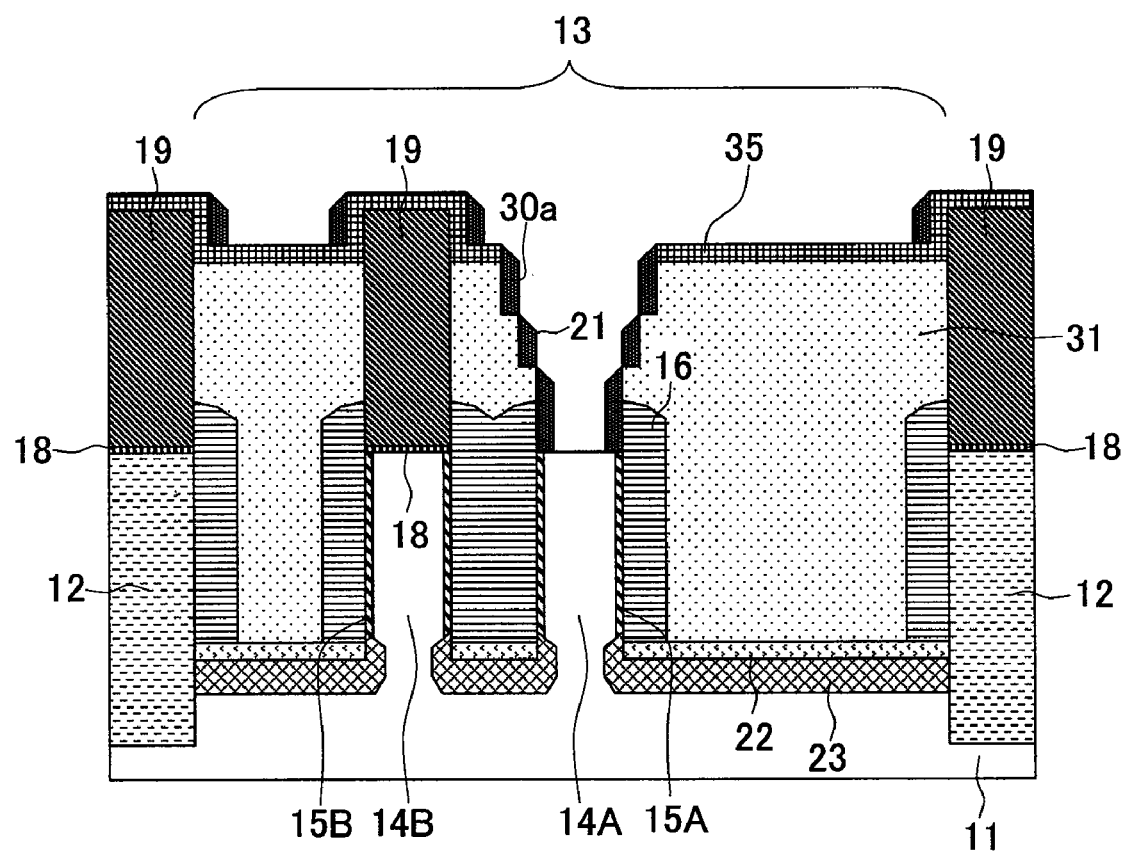
FIG. 21 is a process diagram for explaining the manufacturing method of the semiconductor device according to the present embodiment and is a plan view of the semiconductor device.
Figure 22:
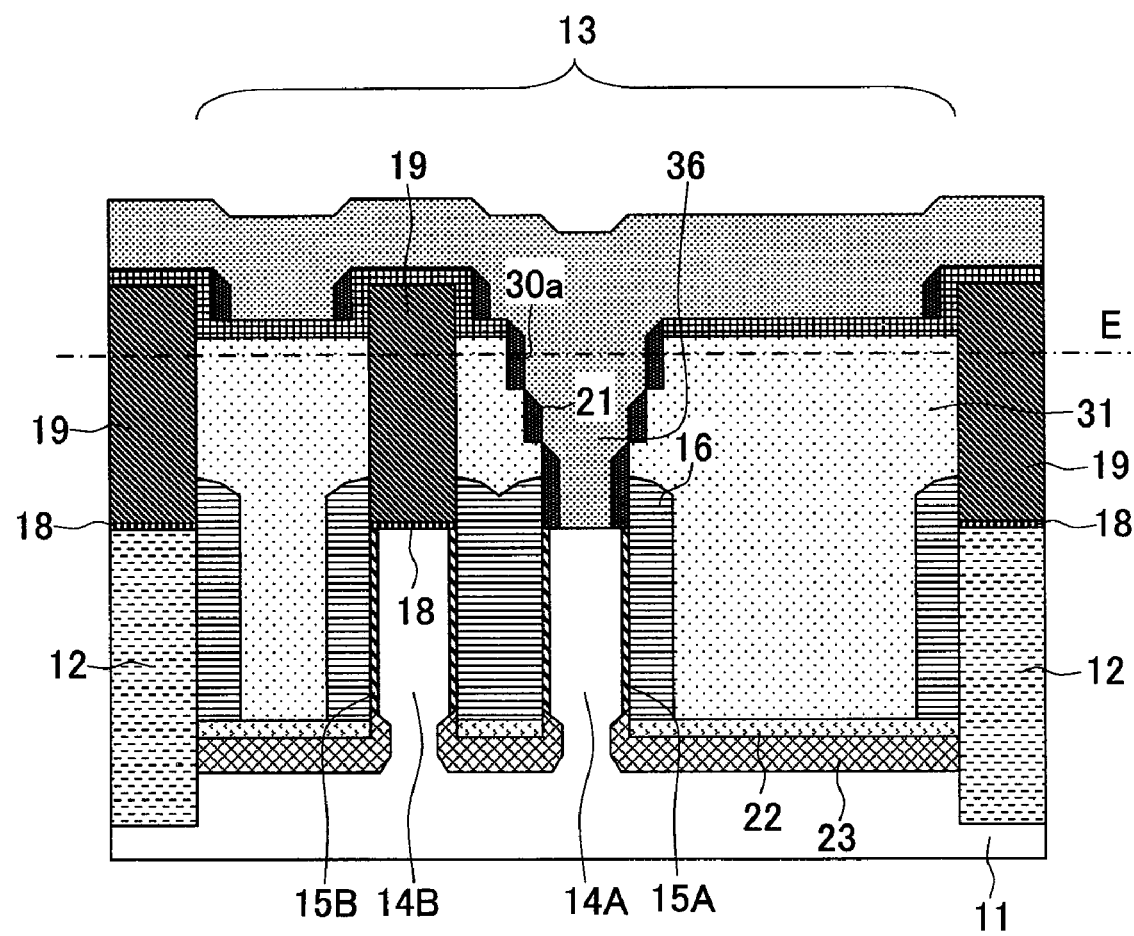
FIG. 22 is a process diagram for explaining the manufacturing method of the semiconductor device according to the present embodiment and is a plan view of the semiconductor device.

After the through-hole 30a is formed, the sidewall dielectric film 21 that covers the inner wall of the through-hole 30a is formed (FIG. 21). Specifically, a silicon nitride film is deposited by the LP-CVD method, and this film is etched by the anisotropic nitride-film dry etching, thereby forming the sidewall dielectric film 21 made of a silicon nitride film. The sidewall dielectric film 21 is formed to insulate the conductive material filled in the through-hole 30a in a process described later from the gate electrode 16.

Figure 23:
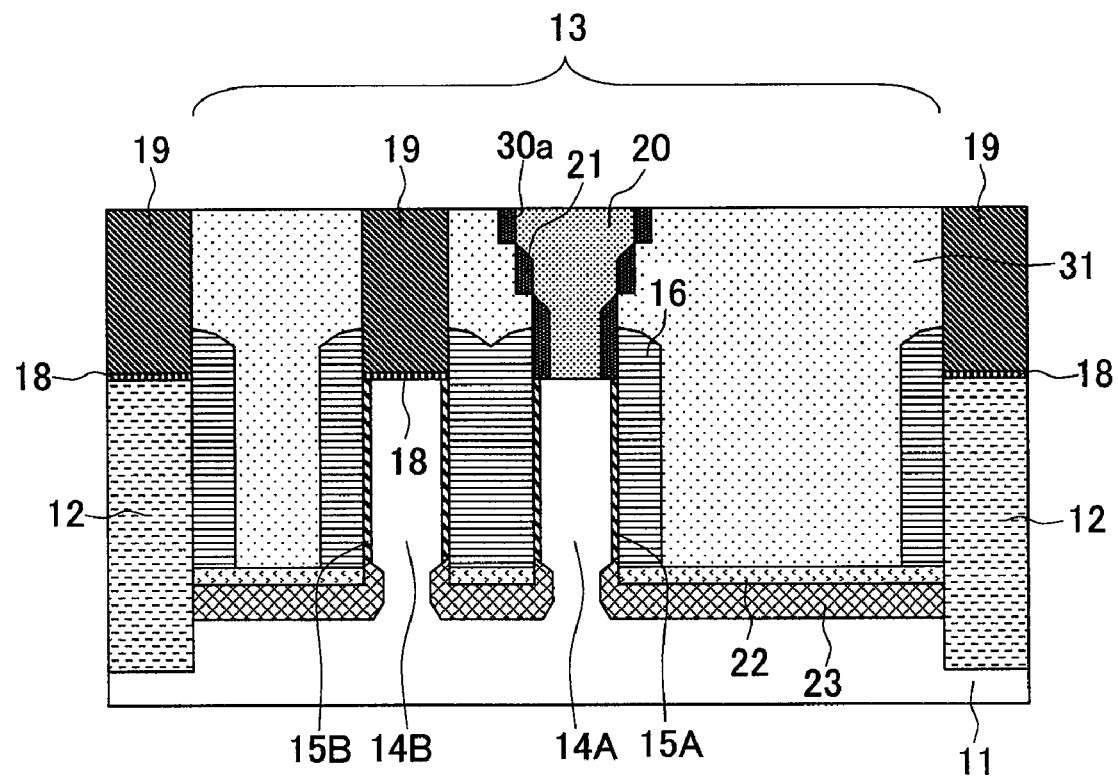
FIG. 23 is a process diagram for explaining the manufacturing method of the semiconductor device according to the present embodiment and is a plan view of the semiconductor device.

Next, a conductive material 36 such as polycrystalline silicon is filled into the through-hole 30a. Specifically, the conductive material 36 is deposited to fill the inside of the through-hole 30a with the conductive material 36 (FIG. 22), and a surface is polished by CMP to completely remove the diameter-expansion dielectric film 35 (FIG. 23). By this CMP, the surface is polished to near a chain line E shown in FIG. 22. After the CMP, arsenic ion-implantation and activation RTA are performed on the conductive material 36. As a result, the first diffusion layer 20 having a sufficiently larger area of the upper surface than that of the upper surface of the first silicon pillar 14A is completed.

Thereafter, an interlayer dielectric film is further deposited, and this film is integrated with the first interlayer dielectric film 31 to form the interlayer dielectric film 30 as shown in FIG. 1. A surface of the interlayer dielectric film 30 is flattened by CMP and the like, and thereafter, the three through-hole conductors DC1, DC2, and GC described above are formed. Further, the wiring layer 25 is formed on the interlayer dielectric film 30.

It is apparent that the present invention is not limited to the above embodiments, but may be modified and changed without departing from the scope and spirit of the invention.

In the above embodiment, for example, although the diameter-expansion dielectric film 35 is configured by a silicon nitride film, the diameter-expansion dielectric film 35 can be configured by a silicon oxinitride film. It is preferable that the silicon oxinitride film is formed by CVD by introducing DCS ($SiH_2Cl_2$) gas of 70 to 200 sccm, $NH_3$ gas of 50 to 200 sccm, $N_2O$ gas of 200 to 600 sccm at a temperature around 630 to 700° C. and under a pressure of 120 to 200 Pa. An etching rate of a silicon oxinitride film and that of a silicon nitride film by thermal phosphoric acid, respectively, are different (the etching rate of the silicon oxinitride film is about one third of that of a silicon nitride film). Therefore, by appropriately selecting either a silicon nitride film or a silicon oxinitride film, the progress level of etching in a lateral direction can be adjusted.

Furthermore, in the above embodiment, while the first diffusion layer 20 is formed by performing arsenic ion-implantation and activation RTA on the conductive material within the through-hole 30a, the first diffusion layer 20 can be provided within the first silicon pillar 14A. In this case, the conductive material within the through-hole 30a functions as a conductive layer to electrically connect the first-diffusion-layer contact plug DC1 and the first silicon pillar 14A. According to the present invention, a relatively large contact margin of the first-diffusion-layer contact plug DC1 to the conductive layer can be obtained.

In addition, while not specifically claimed in the claim section, the applicant reserves the right to include in the claim section of the application at any appropriate time the following methods:

A1. A manufacturing method of a semiconductor device comprising:

forming a mask pattern on a main surface of a silicon substrate, the mask pattern comprising a first insulation material and including a first sub-mask pattern corresponding to a formation position of a first silicon pillar and other sub-mask patterns;

forming at least the first silicon pillar by etching the silicon substrate by using the mask pattern;

covering the main surface with a first interlayer dielectric film comprising a second insulation material different from the first insulation material, while leaving at least the first sub-mask pattern;

forming a through-hole in the first interlayer dielectric film, the through-hole including a space formed by removing the first sub-mask pattern and having a larger area of an upper-side opening than an area of an upper surface of the first silicon pillar;

filling the through-hole with a conductive material; and forming a first-diffusion-layer contact plug in contact with an upper surface of the conductive material.

A2. The manufacturing method of a semiconductor device as claimed in claim A1, wherein forming the through-hole comprises:

etching back the first interlayer dielectric film so as to project an upper end of the mask pattern from the first interlayer dielectric film;

forming a diameter-expansion dielectric film comprising the first insulation material that covers an entire surface including the projected mask pattern;

forming a second interlayer dielectric film comprising the second insulation material that covers the diameter-expansion dielectric film and has an opening exposing an upper surface of the first sub-mask pattern or a portion of the diameter-expansion dielectric film formed on the upper surface of the first sub-mask pattern;

removing the first sub-mask pattern and the diameter-expansion dielectric film near the first sub-mask pattern by wet etching through the opening; and etching the second and first interlayer dielectric films by selective anisotropic dry etching.

A3. The manufacturing method of a semiconductor device as claimed in claim A2, wherein a film thickness of the diameter-expansion dielectric film is determined such that an etchant does not reach the other sub-mask patterns when the wet etching is performed.

A4. The manufacturing method of a semiconductor device as claimed in claim A1, wherein forming the through-hole comprises:

etching back the first interlayer dielectric film so as to project an upper end of the mask pattern from the first interlayer dielectric film;

forming a diameter-expansion dielectric film comprising a third insulation material different from the first and second insulation materials that covers an entire surface including the projected mask pattern;

forming a second interlayer dielectric film comprising the second insulation material that covers the diameter-expansion dielectric film and has an opening exposing an upper surface of the first sub-mask pattern or a portion of the diameter-expansion dielectric film formed on the upper surface of the first sub-mask pattern;

removing the first sub-mask pattern and the diameter-expansion dielectric film near the first sub-mask pattern by wet etching through the opening; and etching the second and first interlayer dielectric films by selective anisotropic dry etching.

A5. The manufacturing method of a semiconductor device as claimed in claim A4, wherein the third insulation material is selected such that an etchant does not reach the other sub-mask patterns when the wet etching is performed.

A6. The manufacturing method of a semiconductor device as claimed in claim A2, wherein forming the second interlayer dielectric film comprises:

depositing the second interlayer dielectric film; and forming the opening in the second interlayer dielectric film by lithography and anisotropic dry etching.

A7. The manufacturing method of a semiconductor device as claimed in claim A1, further comprising forming a sidewall dielectric film on an inner wall of the through-hole before filling the through-hole with the conductive material.

A8. The manufacturing method of a semiconductor device as claimed in claim A1, wherein the conductive material filled into the through-hole comprises polycrystalline silicon into which an impurity is doped.

A9. The manufacturing method of a semiconductor device as claimed in claim A1, wherein the first insulation material is a silicon nitride, and the second insulation material is a silicon oxide.

A10. The manufacturing method of a semiconductor device as claimed in claim A4, wherein the first insulation material is a silicon nitride, the second insulation material is a silicon oxide, and the third insulation material is a silicon oxinitride.

What is claimed is:

1. A semiconductor device comprising:
   a substrate;
   a first silicon pillar projecting substantially perpendicularly with respect to a main surface of the substrate;
   an interlayer dielectric film that covers the main surface of the substrate, the interlayer dielectric film having a through-hole into which a conductive material is buried, the through-hole having a lower-side opening that exposes an upper surface of the first silicon pillar and an upper side opening;
   a first diffusion layer formed in or neighboring an upper part of the first silicon pillar;
   a second diffusion layer formed in or neighboring a lower part of the first silicon pillar;
   a first-diffusion-layer contact plug provided on the upper-side opening of the through-hole so as to contact the conductive material within the through-hole; and
   a gate electrode that covers a side surface of the first silicon pillar via a first gate dielectric film, wherein
   an area of the lower-side opening of the through-hole is substantially equal to an area of the upper surface of the first silicon pillar,
   an area of the upper-side opening of the through-hole is larger than the area of the lower-side opening of the through-hole, and
   an area of a contact surface between the conductive material within the through-hole and the first-diffusion-layer contact plug is larger than the area of the upper surface of the first silicon pillar.

2. The semiconductor device as claimed in claim 1, wherein an area of a cross section parallel to the main surface at a relatively upper position of the through-hole is larger than an area of a cross section parallel to the main surface at a relatively lower position of the through-hole.

3. The semiconductor device as claimed in claim 1, wherein a center of the through-hole and a center of the first silicon pillar match each other as viewed from perpendicular direction with respect to the main surface of the substrate.

4. The semiconductor device as claimed in claim 1, further comprising a sidewall dielectric film that covers an inner wall of the through-hole.

5. The semiconductor device as claimed in claim 1, wherein the conductive material within the through-hole serves as the first diffusion layer.

6. The semiconductor device as claimed in claim 1, further comprising:
   a second silicon pillar parallel to the first silicon pillar;
   a cap insulation film that covers an upper part of the second silicon pillar; and
   a gate contact plug, wherein
   the gate electrode also covers a side surface of the second silicon pillar via a second gate dielectric film, and
   the gate contact plug is connected to the upper surface of the gate electrode that is positioned at a part of a periphery of the second silicon pillar.

7. The semiconductor device as claimed in claim 6, wherein the interlayer dielectric film comprises a silicon oxide, and the cap insulation film comprises a silicon nitride.

8. The semiconductor device as claimed in claim 1, further comprising a second-diffusion-layer contact plug connected to the second diffusion layer.

* * * * *